US011881876B2

United States Patent
Yamaguchi

(10) Patent No.: US 11,881,876 B2
(45) Date of Patent: Jan. 23, 2024

(54) RADIO FREQUENCY MODULE AND COMMUNICATION DEVICE

(71) Applicant: Murata Manufacturing Co., Ltd., Nagaokakyo (JP)

(72) Inventor: Yukiya Yamaguchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/840,604

(22) Filed: Jun. 15, 2022

(65) Prior Publication Data

US 2022/0311456 A1    Sep. 29, 2022

Related U.S. Application Data

(63) Continuation of application No. 17/207,742, filed on Mar. 22, 2021, now Pat. No. 11,394,406.

(30) Foreign Application Priority Data

Mar. 27, 2020    (JP) .................................. 2020-057626

(51) Int. Cl.
*H04B 1/00*    (2006.01)
*H04B 1/04*    (2006.01)

(52) U.S. Cl.
CPC ............ *H04B 1/006* (2013.01); *H04B 1/0078* (2013.01); *H04B 1/04* (2013.01); *H04B 2001/0408* (2013.01)

(58) Field of Classification Search
CPC ........ H04B 1/006; H04B 1/0078; H04B 1/04; H04B 2001/0408
See application file for complete search history.

(56) References Cited

U.S. PATENT DOCUMENTS

| 6,766,149 B1 * | 7/2004 | Hikita ..................... | H03H 9/725 343/702 |
| 7,242,268 B2 * | 7/2007 | Hagiwara ................ | H03H 7/42 333/133 |
| 8,660,603 B2 * | 2/2014 | Block ..................... | H04B 1/006 455/88 |

(Continued)

FOREIGN PATENT DOCUMENTS

| JP | 2018-137522 A | 8/2018 |
| KR | 10-2006-0054090 A | 5/2006 |
| WO | 2018/168500 A1 | 9/2018 |

OTHER PUBLICATIONS

Korean Office Action dated Mar. 24, 2022 in Korean Application No. 10-2021-0030526.

*Primary Examiner* — Jinsong Hu
*Assistant Examiner* — Rui M Hu
(74) *Attorney, Agent, or Firm* — XSENSUS LLP

(57) ABSTRACT

A radio frequency module includes: a module board that includes a first principal surface and a second principal surface on opposite sides of the module board; a first power amplifier disposed on the first principal surface and configured to amplify a transmission signal in a first frequency band; a second power amplifier disposed on the first principal surface and configured to amplify a transmission signal in a second frequency band different from the first frequency band; and a switch disposed on the second principal surface and connected to an output terminal of the first power amplifier and an output terminal of the second power amplifier.

17 Claims, 7 Drawing Sheets

(56) References Cited

U.S. PATENT DOCUMENTS

| | | | | |
|---|---|---|---|---|
| 8,803,632 B2* | 8/2014 | Takeuchi | | H03H 7/38 |
| | | | | 333/101 |
| 9,071,225 B2* | 6/2015 | Nishihara | | H03H 9/173 |
| 9,118,302 B2* | 8/2015 | Shimizu | | H03H 7/461 |
| 9,178,555 B2* | 11/2015 | Ichitsubo | | H04B 1/0067 |
| 9,219,467 B2* | 12/2015 | Inoue | | H03H 9/70 |
| 9,252,832 B2* | 2/2016 | Matsuo | | H04B 1/0458 |
| 9,660,687 B2* | 5/2017 | Ellä | | H04B 1/006 |
| 9,780,735 B1* | 10/2017 | Obiya | | H03F 1/26 |
| 9,866,366 B2* | 1/2018 | Pehlke | | H04L 5/14 |
| 9,929,769 B1* | 3/2018 | Guyette | | H04B 1/401 |
| 10,075,199 B2* | 9/2018 | King | | H04B 7/0868 |
| 10,149,347 B2* | 12/2018 | Huang | | H01L 21/76 |
| 10,237,050 B2* | 3/2019 | Khlat | | H04L 5/1461 |
| 10,367,474 B2* | 7/2019 | Park | | H03H 9/725 |
| 10,756,705 B2* | 8/2020 | Park | | H03H 9/725 |
| 10,886,884 B2* | 1/2021 | Wang | | H03H 7/06 |
| 11,165,406 B2* | 11/2021 | Lin | | H03H 9/02007 |
| 11,329,675 B2* | 5/2022 | Tahara | | H04B 1/0053 |
| 2002/0137471 A1* | 9/2002 | Satoh | | H04B 1/406 |
| | | | | 455/553.1 |
| 2003/0027532 A1* | 2/2003 | Ito | | H04B 1/408 |
| | | | | 455/73 |
| 2003/0092397 A1* | 5/2003 | Uriu | | H03H 7/465 |
| | | | | 455/78 |
| 2004/0048634 A1* | 3/2004 | Satoh | | H04B 1/006 |
| | | | | 455/562.1 |
| 2004/0071111 A1* | 4/2004 | Satoh | | H04B 1/48 |
| | | | | 370/329 |
| 2004/0075491 A1* | 4/2004 | Kushitani | | H04B 1/44 |
| | | | | 330/51 |
| 2004/0203552 A1* | 10/2004 | Horiuchi | | H03F 3/245 |
| | | | | 455/333 |
| 2004/0217914 A1* | 11/2004 | Yamashita | | H04B 1/44 |
| | | | | 343/850 |
| 2004/0232982 A1* | 11/2004 | Ichitsubo | | H01L 24/49 |
| | | | | 330/129 |
| 2005/0003855 A1* | 1/2005 | Wada | | H04B 1/005 |
| | | | | 455/168.1 |
| 2005/0037800 A1* | 2/2005 | Shih | | H04B 1/006 |
| | | | | 455/552.1 |
| 2005/0104685 A1* | 5/2005 | Kuroki | | H05K 1/16 |
| | | | | 333/133 |
| 2005/0197095 A1* | 9/2005 | Nakamata | | H04B 1/006 |
| | | | | 455/403 |
| 2005/0221768 A1* | 10/2005 | Kemmochi | | H01P 1/2135 |
| | | | | 455/78 |
| 2006/0044080 A1* | 3/2006 | Hagiwara | | H03H 7/42 |
| | | | | 335/193 |
| 2006/0094393 A1* | 5/2006 | Okuyama | | H04B 1/44 |
| | | | | 455/333 |
| 2006/0117163 A1* | 6/2006 | Okuyama | | H05K 1/0218 |
| | | | | 712/1 |
| 2006/0250182 A1* | 11/2006 | Takeda | | H03G 1/0088 |
| | | | | 330/129 |
| 2006/0284703 A1* | 12/2006 | Iwasaki | | H03H 9/0095 |
| | | | | 333/133 |
| 2007/0053167 A1* | 3/2007 | Ueda | | H05K 1/144 |
| | | | | 257/E23.125 |
| 2007/0058748 A1* | 3/2007 | Kim | | H04B 1/52 |
| | | | | 375/295 |
| 2007/0066243 A1* | 3/2007 | Yamauchi | | H04B 1/40 |
| | | | | 455/78 |
| 2007/0108584 A1* | 5/2007 | Fluhr | | H04B 1/036 |
| | | | | 257/690 |
| 2007/0183348 A1* | 8/2007 | Totsuka | | H03H 9/725 |
| | | | | 370/276 |
| 2008/0166980 A1* | 7/2008 | Fukamachi | | H04B 1/0057 |
| | | | | 455/83 |
| 2009/0093270 A1* | 4/2009 | Block | | H04B 1/52 |
| | | | | 455/552.1 |
| 2009/0128254 A1* | 5/2009 | Goi | | H04B 1/0067 |
| | | | | 333/101 |
| 2009/0195334 A1* | 8/2009 | Goi | | H04B 1/03 |
| | | | | 333/203 |
| 2010/0091752 A1* | 4/2010 | Kemmochi | | H03H 7/463 |
| | | | | 370/339 |
| 2010/0135193 A1* | 6/2010 | Przadka | | H04B 1/0057 |
| | | | | 370/297 |
| 2010/0157860 A1* | 6/2010 | Hagiwara | | H04B 1/48 |
| | | | | 370/310 |
| 2011/0063028 A1* | 3/2011 | Kawakami | | H03F 3/602 |
| | | | | 330/252 |
| 2011/0110452 A1* | 5/2011 | Fukamachi | | H04B 1/0057 |
| | | | | 375/267 |
| 2011/0193614 A1* | 8/2011 | Murase | | H04B 1/006 |
| | | | | 327/419 |
| 2011/0222443 A1* | 9/2011 | Khlat | | H03F 3/68 |
| | | | | 330/252 |
| 2011/0279193 A1* | 11/2011 | Furutani | | H03H 9/0566 |
| | | | | 333/132 |
| 2012/0075002 A1* | 3/2012 | Uejima | | H04B 1/006 |
| | | | | 327/365 |
| 2012/0274416 A1* | 11/2012 | Hara | | H03H 9/725 |
| | | | | 333/195 |
| 2012/0293277 A1* | 11/2012 | Hara | | H03H 9/132 |
| | | | | 333/133 |
| 2013/0099864 A1* | 4/2013 | Kawai | | H01P 5/10 |
| | | | | 330/276 |
| 2013/0109433 A1* | 5/2013 | Wang | | H04B 1/406 |
| | | | | 455/552.1 |
| 2013/0141180 A1* | 6/2013 | Uejima | | H03H 7/42 |
| | | | | 333/26 |
| 2013/0176915 A1* | 7/2013 | Uejima | | H04B 1/0057 |
| | | | | 370/278 |
| 2013/0272176 A1* | 10/2013 | Uejima | | H04B 1/006 |
| | | | | 370/282 |
| 2014/0002209 A1* | 1/2014 | Ono | | H01P 1/2135 |
| | | | | 333/101 |
| 2014/0015603 A1* | 1/2014 | Scott | | H03F 1/26 |
| | | | | 330/147 |
| 2014/0235184 A1* | 8/2014 | Ichitsubo | | H04B 1/0067 |
| | | | | 455/101 |
| 2014/0307836 A1* | 10/2014 | Khlat | | H04B 1/04 |
| | | | | 375/343 |
| 2015/0061406 A1* | 3/2015 | Ono | | H05K 1/18 |
| | | | | 307/112 |
| 2015/0303971 A1* | 10/2015 | Reisner | | H01L 29/737 |
| | | | | 330/307 |
| 2015/0304059 A1* | 10/2015 | Zuo | | H04B 1/0064 |
| | | | | 370/343 |
| 2015/0311922 A1* | 10/2015 | Bakalski | | H04B 1/006 |
| | | | | 455/552.1 |
| 2015/0326326 A1* | 11/2015 | Nobbe | | H03F 1/30 |
| | | | | 375/224 |
| 2016/0079934 A1* | 3/2016 | Ichitsubo | | H04B 1/006 |
| | | | | 330/251 |
| 2016/0099800 A1* | 4/2016 | Park | | H04B 1/44 |
| | | | | 370/275 |
| 2016/0226552 A1* | 8/2016 | Jin | | H04B 1/123 |
| 2016/0241207 A1* | 8/2016 | Lehtola | | H03F 3/24 |
| 2016/0301382 A1* | 10/2016 | Iwamoto | | H03H 9/0566 |
| 2016/0315653 A1* | 10/2016 | Saji | | H04B 1/0064 |
| 2017/0033773 A1* | 2/2017 | Reid | | H03H 19/004 |
| 2017/0077877 A1* | 3/2017 | Anderson | | H03F 1/0261 |
| 2017/0093442 A1* | 3/2017 | Jayaraman | | H04B 7/04 |
| 2017/0141801 A1* | 5/2017 | Watanabe | | H03H 9/64 |
| 2017/0201291 A1* | 7/2017 | Gu | | H01L 23/60 |
| 2017/0222666 A1* | 8/2017 | Hyun | | H01Q 21/205 |
| 2017/0264336 A1* | 9/2017 | Saji | | H04L 5/14 |
| 2017/0264337 A1* | 9/2017 | Kogure | | H03J 7/186 |
| 2017/0288707 A1* | 10/2017 | Yun | | H04B 1/0057 |
| 2017/0303400 A1* | 10/2017 | Frenette | | H10N 30/30 |
| 2017/0338839 A1* | 11/2017 | Little | | H04B 1/56 |
| 2017/0353287 A1* | 12/2017 | Onaka | | H04B 1/0057 |
| 2018/0047673 A1* | 2/2018 | Gu | | H01L 23/481 |
| 2018/0138927 A1* | 5/2018 | Nagumo | | H04L 5/001 |
| 2018/0138930 A1* | 5/2018 | King | | H04B 1/56 |

(56) References Cited

U.S. PATENT DOCUMENTS

| | | | | |
|---|---|---|---|---|
| 2018/0152945 A1* | 5/2018 | Balteanu | ............... | H04L 5/001 |
| 2018/0167094 A1* | 6/2018 | Aramata | ................ | H04B 1/52 |
| 2018/0190601 A1* | 7/2018 | Hitomi | ................... | H03F 3/213 |
| 2018/0226928 A1* | 8/2018 | Obiya | ..................... | H04B 1/00 |
| 2018/0226949 A1* | 8/2018 | Caron | ................... | H03H 9/725 |
| 2018/0227008 A1* | 8/2018 | Obiya | ................. | H04B 1/0458 |
| 2018/0302047 A1* | 10/2018 | Igarashi | ................ | H03F 3/217 |
| 2019/0036488 A1* | 1/2019 | Nakajima | ................ | H03F 1/12 |
| 2019/0057942 A1* | 2/2019 | Male | ................ | H01L 23/49513 |
| 2019/0190548 A1* | 6/2019 | Chang | ....................... | H04L 5/14 |
| 2019/0214354 A1* | 7/2019 | Soliman | ............... | F21V 23/006 |
| 2019/0229757 A1* | 7/2019 | Vaillancourt | ............ | H04B 1/18 |
| 2019/0268046 A1* | 8/2019 | Kim | ..................... | H04B 7/0413 |
| 2019/0273478 A1* | 9/2019 | Lin | ........................ | H03H 9/568 |
| 2019/0273480 A1* | 9/2019 | Lin | ........................ | H03H 9/725 |
| 2019/0273521 A1* | 9/2019 | Nishikawa | ........... | H05K 1/0233 |
| 2019/0326234 A1* | 10/2019 | Benson | ................ | H01L 23/053 |
| 2019/0326879 A1* | 10/2019 | Nakamura | .......... | H03H 9/02834 |
| 2019/0348968 A1* | 11/2019 | Park | ...................... | H04B 1/006 |
| 2020/0014429 A1* | 1/2020 | Leung | ................. | H04B 1/0483 |
| 2020/0099134 A1* | 3/2020 | Rodríguez | ........... | H01Q 9/0442 |
| 2020/0099348 A1* | 3/2020 | Gebeyehu | ............... | H03F 1/565 |
| 2020/0112300 A1* | 4/2020 | Balteanu | ............... | H04B 1/401 |
| 2020/0168970 A1* | 5/2020 | Brunette | ............. | H05K 9/0039 |
| 2020/0177212 A1* | 6/2020 | Cong | ................. | H04B 1/0057 |
| 2020/0274520 A1* | 8/2020 | Shin | ...................... | H03H 9/131 |
| 2020/0358464 A1* | 11/2020 | Abbott | ................ | H03H 9/6406 |
| 2020/0412403 A1* | 12/2020 | Pehlke | ..................... | H04L 5/14 |
| 2021/0044278 A1* | 2/2021 | Kankar | ............... | H04B 1/0057 |
| 2021/0111705 A1* | 4/2021 | Komatsu | ................ | H04B 1/40 |
| 2021/0119650 A1* | 4/2021 | Abbott | .................. | H03H 9/725 |
| 2021/0134771 A1* | 5/2021 | Betsui | .................. | H02M 3/155 |
| 2022/0029588 A1* | 1/2022 | Cao | ........................ | H03F 1/565 |

\* cited by examiner

RADIO FREQUENCY MODULE AND COMMUNICATION DEVICE

CROSS-REFERENCE TO RELATED APPLICATIONS

The present application is a continuation of U.S. application Ser. No. 17/207,742, filed Mar. 22, 2021, which is based on and claims priority of Japanese Patent Application No. 2020-057626 filed on Mar. 27, 2020. The entire disclosure of the above-identified applications, including the specification, drawings and claims are incorporated herein by reference in its entirety.

TECHNICAL FIELD

The present disclosure relates to a radio frequency module and a communication device.

BACKGROUND

A power amplifier that amplifies radio frequency transmission signals is provided in a mobile communication apparatus such as a mobile phone. Japanese Unexamined Patent Application Publication No. 2018-137522 discloses a front end circuit (a radio frequency (RF) module) that includes a power amplifier (PA) circuit (a transmission amplifier circuit) that transfers a transmission signal, and a low noise amplifier (LNA) circuit (a reception amplifier circuit) that transfers a reception signal. A PA controller that controls amplification characteristics of a power amplifier is disposed in the transmission amplifier circuit, and an LNA controller that controls amplification characteristics of a low noise amplifier is disposed in the reception amplifier circuit.

SUMMARY

Technical Problems

However, as recognized by the present inventor, amplification performance of a power amplifier is optimized in a specific frequency band (a communication band), and thus the RF module disclosed in Japanese Unexamined Patent Application Publication No. 2018-137522 needs to include power amplifiers that handle signals in frequency bands (communication bands). Consequently, development in multiband technology brings a problem that the size of an RF module increases due to an increase in the number of power amplifiers.

The present disclosure has been conceived in order to solve the above-identified and other problems, and provides a small radio frequency module and a small communication device that support multiband technology.

Solutions

In order to provide such a radio frequency module, a radio frequency module according to an aspect of the present disclosure includes: a module board that includes a first principal surface and a second principal surface on opposite sides of the module board; a first power amplifier disposed on the first principal surface and configured to amplify a transmission signal in a first frequency band; a second power amplifier disposed on the first principal surface and configured to amplify a transmission signal in a second frequency band different from the first frequency band; and a first switch disposed on the second principal surface and connected to an output terminal of the first power amplifier and an output terminal of the second power amplifier.

Advantageous Effects

According to the present disclosure, a small radio frequency module and a small communication device that support multiband technology are provided.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
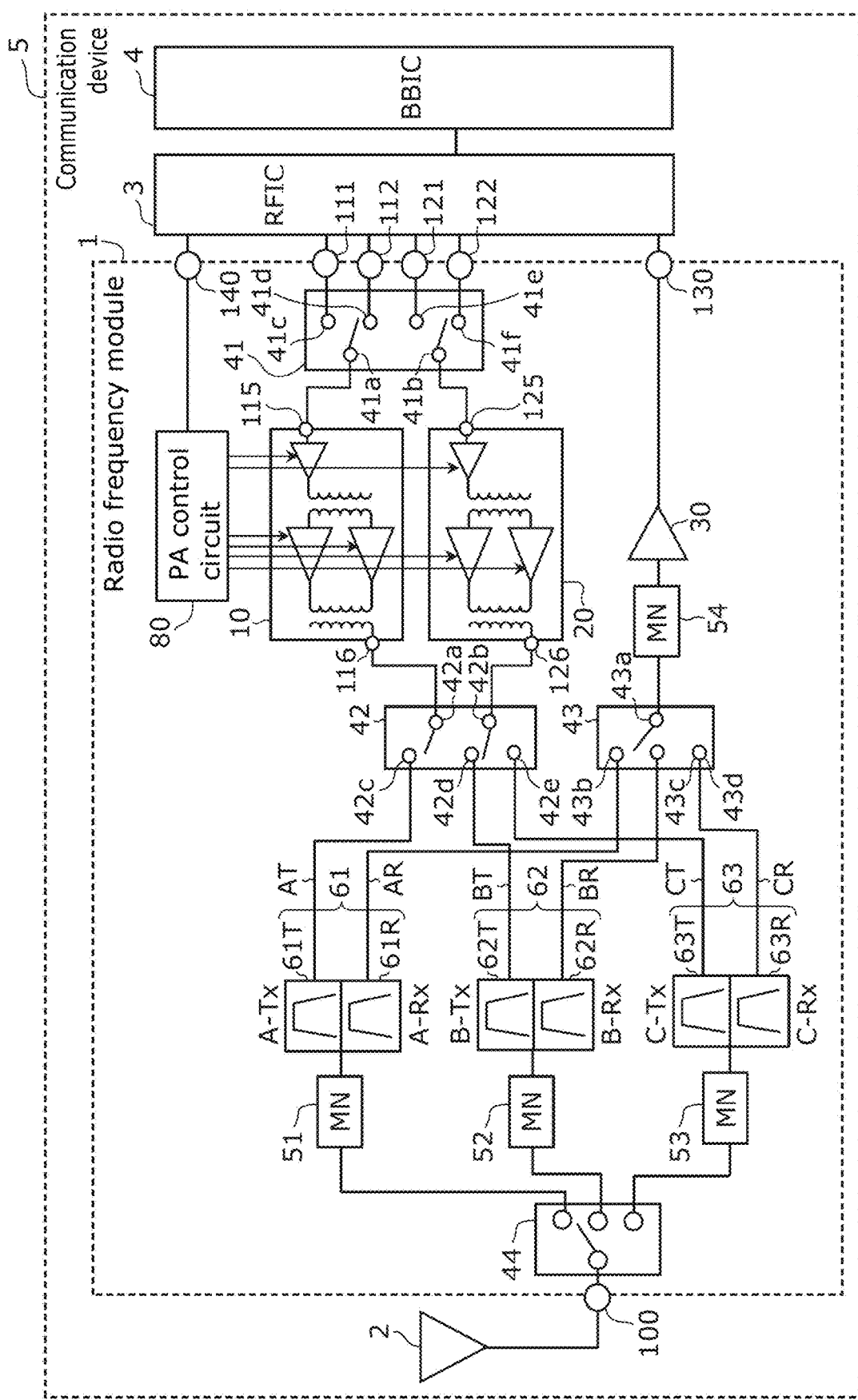
FIG. 1 illustrates a circuit configuration of a radio frequency module and a communication device according to an embodiment.

The following describes in detail embodiments of the present disclosure. Note that the embodiments described below each show a general or specific example. The numerical values, shapes, materials, elements, and the arrangement and connection of the elements, for instance, described in the following embodiments are examples, and thus are not intended to limit the present disclosure. Among the elements in the following examples and variations, elements not recited in any of the independent claims are described as arbitrary elements. In addition, the sizes of elements and the ratios of the sizes illustrated in the drawings are not necessarily accurate. Throughout the drawings, the same numeral is given to substantially the same element, and redundant description may be omitted or simplified.

In the following, a term that indicates a relation between elements such as "parallel" or "perpendicular", a term that indicates the shape of an element such as "rectangular", and a numerical range do not necessarily have only strict meanings, and also cover substantially equivalent ranges that include a difference of about several percent, for example.

In the following, regarding A, B, and C mounted on a board, "C is disposed between A and B in a plan view of a board (or a principal surface of a board)" means at least one of line segments that connect arbitrary points in A and B passes through a region of C in a plan view of a board. A plan view of a board means that a board and a circuit element mounted on the board are viewed, being orthogonally projected onto a plane parallel to a principal surface of the board. In addition, "on" in expressions such as mounted on, disposed on, provided on, and formed on, for example, does not necessarily indicate direct contact.

In the following, a "transmission path" means a transfer route that includes, for instance, a line through which a radio frequency transmission signal propagates, an electrode directly connected to the line, and a terminal directly connected to the line or the electrode. Further, a "reception path" means a transfer route that includes, for instance, a line through which a radio frequency reception signal propagates, an electrode directly connected to the line, and a terminal directly connected to the line or the electrode. In addition, a "transmission and reception path" means a transfer route that includes, for instance, a line through which a radio frequency transmission signal and a radio frequency reception signal propagate, an electrode directly connected to the line, and a terminal directly connected to the line or the electrode.

Embodiment

[1. Circuit Configuration of Radio Frequency Module 1 and Communication Device 5]

FIG. 1 illustrates a circuit configuration of radio frequency module 1 and communication device 5 according to an embodiment. As illustrated in FIG. 1, communication device 5 includes radio frequency module 1, antenna 2, radio frequency (RF) signal processing circuit (RF integrated circuit (RFIC)) 3, and baseband signal processing circuit (BB integrated circuit (BBIC)) 4.

RFIC 3 is an RF signal processing circuit that processes radio frequency signals transmitted and received by antenna 2. Specifically, RFIC 3 processes a reception signal input through a reception path of radio frequency module 1 by down-conversion, for instance, and outputs a reception signal generated by being processed to BBIC 4. RFIC 3 processes a transmission signal input from BBIC 4 by up-conversion, for instance, and outputs a transmission signal generated by being processed to a transmission path of radio frequency module 1.

BBIC 4 is a circuit that processes signals using an intermediate frequency band lower than the frequency range of a radio frequency signal transferred in radio frequency module 1. A signal processed by BBIC 4 is used, for example, as an image signal for image display or as an audio signal for talk through a loudspeaker.

RFIC 3 also functions as a controller that controls connection made by switches 41 42, 43, and 44 included in radio frequency module 1, based on a communication band (a frequency band) to be used. Specifically, RFIC 3 changes connection made by switches 41 to 44 included in radio frequency module 1 according to control signals (not illustrated). Specifically, RFIC 3 outputs digital control signals for controlling switches 41 to 44 to power amplifier (PA) control circuit 80. PA control circuit 80 of radio frequency module 1 controls connection and disconnection of switches 41 to 44 by outputting digital control signals to switches 41 to 44 according to the digital control signals input from RFIC 3.

RFIC 3 also functions as a controller that controls gains of transmission amplifier circuits 10 and 20 included in radio frequency module 1, and power supply voltage Vcc and bias voltage Vbias that are supplied to transmission amplifier circuits 10 and 20. Specifically, RFIC 3 outputs digital control signals to control signal terminal 140 of radio frequency module 1. PA control circuit 80 of radio frequency module 1 adjusts gains of transmission amplifier circuits 10 and 20 by outputting control signals, power supply voltage Vcc, or bias voltage Vbias to transmission amplifier circuits 10 and 20 according to digital control signals input through control signal terminal 140. Note that a control signal terminal that receives, from RFIC 3, digital control signals for controlling gains of transmission amplifier circuits 10 and 20 and a control signal terminal that receives, from RFIC 3, digital control signals for controlling power supply voltage Vcc and bias voltage Vbias that are supplied to transmission amplifier circuits 10 and 20 may be different terminals. The controller may be disposed outside of RFIC 3, and may be disposed in BBIC 4, for example.

Antenna 2 is connected to antenna connection terminal 100 of radio frequency module 1, radiates a radio frequency signal output from radio frequency module 1, and receives and outputs a radio frequency signal from the outside to radio frequency module 1.

Note that antenna 2 and BBIC 4 are not necessarily included in communication device 5 according to the present embodiment.

Next, a detailed configuration of radio frequency module 1 is to be described.

As illustrated in FIG. 1, radio frequency module 1 includes antenna connection terminal 100, transmission amplifier circuits 10 and 20, low noise amplifier 30, transmission filters 61T, 62T, and 63T, reception filters 61R, 62R, and 63R, PA control circuit 80, matching circuits 51, 52, 53, and 54, and switches 41, 42, 43, and 44.

Antenna connection terminal 100 is an antenna common terminal connected to antenna 2.

Transmission amplifier circuit 10 is a difference amplifying type amplifier circuit that amplifies transmission signals in communication bands A and B input through transmission input terminals 111 and 112. Note that radio frequency module 1 may include, instead of transmission amplifier circuit 10, a first transmission amplifier circuit that amplifies a radio frequency signal in communication band A, and a second transmission amplifier circuit that amplifies a radio frequency signal in communication band B.

Transmission amplifier circuit 20 is a difference amplifying type amplifier circuit that amplifies transmission signals in communication band C input through transmission input terminals 121 and 122.

PA control circuit 80 adjusts gains of amplifying elements included in transmission amplifier circuits 10 and 20 according to, for instance, digital control signals input through control signal terminal 140. PA control circuit 80 may be formed as a semiconductor integrated circuit (IC). A semiconductor IC includes a complementary metal oxide semiconductor (CMOS), for example, and specifically, formed by a silicon on insulator (SOI) process. Accordingly, such a semiconductor IC can be manufactured at a low cost. Note that the semiconductor IC may include at least one of gallium arsenide (GaAs), silicon germanium (SiGe), or gallium nitride (GaN). Thus, a radio frequency signal having high amplification quality and high noise quality can be output.

Low noise amplifier 30 amplifies radio frequency signals in communication bands A, B, and C while noise is kept low, and outputs the amplified radio frequency signals to reception output terminal 130. Note that radio frequency module 1 may include a plurality of low noise amplifiers. For example, radio frequency module 1 may include a first low noise amplifier that amplifies radio frequency signals in communication bands A and B, and a second low noise amplifier that amplifies a radio frequency signal in communication band C.

Note that in the present embodiment, communication bands A and B are lower than communication band C, communication bands A and B belong to, for example, a middle band group (ranging from 1.45 GHz to 2.2 GHz), and communication band C belongs to, for example, a high band group (ranging from 2.3 GHz to 2.7 GHz). Note that which of communication bands A, B, and C is the highest, the second highest, and the lowest is not limited to the above example, and communication bands A and B may be higher than communication band C. Note that the middle band group is an example of a first frequency band, and communication band C is an example of a second frequency band different from the first frequency band.

Transmission filter 61T is disposed on transmission path AT that connects transmission input terminals 111 and 112 and antenna connection terminal 100, and passes a transmission signal in the transmission band of communication band A, within a transmission signal amplified by transmission amplifier circuit 10. Transmission filter 62T is disposed on transmission path BT that connects transmission input terminals 111 and 112 and antenna connection terminal 100, and passes a transmission signal in the transmission band of communication band B, within a transmission signal amplified by transmission amplifier circuit 10. Transmission filter 63T is disposed on transmission path CT that connects transmission input terminals 121 and 122 and antenna connection terminal 100, and passes a transmission signal in the transmission band of communication band C, within a transmission signal amplified by transmission amplifier circuit 20.

Reception filter 61R is disposed on reception path AR that connects reception output terminal 130 and antenna connection terminal 100, and passes a reception signal in the reception band of communication band A, within a reception signal input through antenna connection terminal 100. Reception filter 62R is disposed on reception path BR that connects reception output terminal 130 and antenna connection terminal 100, and passes a reception signal in the reception band of communication band B, within a reception signal input through antenna connection terminal 100. Reception filter 63R is disposed on reception path CR that connects reception output terminal 130 and antenna connection terminal 100, and passes a reception signal in the reception band of communication band C, within a reception signal input through antenna connection terminal 100.

Transmission filter 61T and reception filter 61R constitute duplexer 61 having a passband that is communication band A. Duplexer 61 transfers a transmission signal and a reception signal in communication band A by frequency division duplex (FDD). Transmission filter 62T and reception filter 62R constitute duplexer 62 having a passband that is communication band B. Duplexer 62 transfers a transmission signal and a reception signal in communication band B by FDD. Transmission filter 63T and reception filter 63R constitute duplexer 63 having a passband that is communication band C. Duplexer 63 transfers a transmission signal and a reception signal in communication band C by FDD.

Note that duplexers 61 to 63 may each be a multiplexer that includes only a plurality of transmission filters, a multiplexer that includes only a plurality of reception filters, or a multiplexer that includes a plurality of duplexers. Transmission filter 61T and reception filter 61R may not constitute duplexer 61, and may be a single filter for signals transferred by time division duplex (TDD). In this case, one or more switches that switch between transmission and reception are disposed upstream, disposed downstream, or disposed upstream and downstream from the single filter. Similarly, transmission filter 62T and reception filter 62R may not constitute duplexer 62, and may be a single filter for signals transferred by TDD. Similarly, transmission filter 63T and reception filter 63R may not constitute duplexer 63, and may be a single filter for signals transferred by TDD.

Matching circuit 51 is disposed on a path that connects switch 44 and duplexer 61, and matches the impedance between (i) duplexer 61 and (ii) switch 44 and antenna 2. Matching circuit 52 is disposed on a path that connects switch 44 and duplexer 62, and matches the impedance between (i) duplexer 62 and (ii) switch 44 and antenna 2. Matching circuit 53 is disposed on a path that connects switch 44 and duplexer 63, and matches the impedance between (i) duplexer 63 and (ii) switch 44 and antenna 2.

Matching circuit 54 is disposed on a reception path that connects low noise amplifier 30 and switch 43, and matches the impedance between (i) low noise amplifier 30 and (ii) switch 43 and duplexers 61 to 63.

Switch 41 includes common terminals 41a and 41b and selection terminals 41c, 41d, 41e, and 41f. Common terminal 41a is connected to input terminal 115 of transmission amplifier circuit 10. Common terminal 41b is connected to input terminal 125 of transmission amplifier circuit 20. Selection terminal 41c is connected to transmission input terminal 111, selection terminal 41d is connected to transmission input terminal 112, selection terminal 41e is connected to transmission input terminal 121, and selection terminal 41f is connected to transmission input terminal 122. Switch 41 is disposed on an input terminal side of transmission amplifier circuits 10 and 20. This connection configuration allows switch 41 to switch connection of transmission amplifier circuit 10 between transmission input terminal 111 and transmission input terminal 112, and to switch connection of transmission amplifier circuit 20 between transmission input terminal 121 and transmission input terminal 122. Switch 41 includes a double pole four throw (DP4T) switch circuit, for example.

Note that switch 41 may include a single pole double throw (SPDT) switch that includes common terminal 41a and selection terminals 41c and 41d, and an SPDT switch that includes common terminal 41b and selection terminals 41e and 41f.

A transmission signal in communication band A, for example, is input through transmission input terminal 111, and a transmission signal in communication band B, for example, is input through transmission input terminal 112. Further, transmission signals in communication band C, for example, are input through transmission input terminals 121 and 122.

A transmission signal in communication band A or B in the fourth generation mobile communication system (4G), for example, may be input through transmission input terminal 111, and a transmission signal in communication band A or B in the fifth generation mobile communication system (5G), for example, may be input through transmission input terminal 112. Further, a transmission signal in communication band C in 4G, for example, may be input through transmission input terminal 121, and a transmission signal in communication band C in 5G, for example, may be input through transmission input terminal 122.

Note that switch 41 may be an SPDT switch circuit in which the common terminal is connected to a transmission input terminal (referred to as a first transmission input terminal) out of transmission input terminals 111, 112, 121, and 122, one selection terminal is connected to input terminal 115 of transmission amplifier circuit 10, and the other selection terminal is connected to input terminal 125 of transmission amplifier circuit 20.

In this case, for example, a transmission signal in one of communication bands A, B, and C is selectively input through the first transmission input terminal, and switch 41 switches connection of the first transmission input terminal between transmission amplifier circuit 10 and transmission amplifier circuit 20 according to an input transmission signal. A 4G transmission signal and a 5G transmission signal, for example, may be input through the first transmission input terminal, and switch 41 may switch connection of the first transmission input terminal between transmission amplifier circuit 10 and transmission amplifier circuit 20 according to an input transmission signal.

Switch 41 may include a double pole double throw (DPDT) switch circuit that includes two common terminals and two selection terminals. In this case, the first transmission input terminal is connected to one of the common terminals, and a second transmission input terminal is connected to the other common terminal. One of the selection terminals is connected to transmission amplifier circuit 10, and the other selection terminal is connected to transmission amplifier circuit 20. This connection configuration allows switch 41 to switch connection of the one common terminal between the one selection terminal and the other selection terminal, and switches connection of the other common terminal between the one selection terminal and the other selection terminal.

In this case, for example, a transmission signal in communication band A or B is input through the first transmission input terminal, and a transmission signal in communication band C is input through the second transmission input terminal. For example, a 4G transmission signal may be input through the first transmission input terminal, and a 5G transmission signal may be input through the second transmission input terminal.

Switch 42 is an example of a first switch, and is connected to an output terminal of power amplifier 10A via output transformer 15 described below and also to an output terminal of power amplifier 20A via output transformer 25 described below. Switch 42 includes common terminals 42a and 42b and selection terminals 42c, 42d, and 42e. Common terminal 42a is connected to output terminal 116 of transmission amplifier circuit 10, and common terminal 42b is connected to output terminal 126 of transmission amplifier circuit 20. Selection terminal 42c is connected to transmission filter 61T, selection terminal 42d is connected to transmission filter 62T, and selection terminal 42e is connected to transmission filter 63T. Switch 42 is disposed on an output terminal side of transmission amplifier circuits 10 and 20. This connection configuration allows switch 42 to switch connection of transmission amplifier circuit 10 between transmission filter 61T and transmission filter 62T, and switches between connection and disconnection of transmission amplifier circuit 20 to/from transmission filter 63T. Switch 42 includes a double pole three throw (DP3T) switch circuit, for example.

Note that switch 42 may include an SPDT switch that includes common terminal 42a and selection terminals 42c and 42d, and a single pole single throw (SPST) switch that includes common terminal 42b and selection terminal 42e. The numbers of common terminals and selection terminals included in switch 42 are determined as appropriate according to the number of transmission paths that radio frequency module 1 has.

Switch 43 includes common terminal 43a and selection terminals 43b, 43c, and 43d. Common terminal 43a is connected to an input terminal of low noise amplifier 30 via matching circuit 54. Selection terminal 43b is connected to reception filter 61R, selection terminal 43c is connected to reception filter 62R, and selection terminal 43d is connected to reception filter 63R. This connection configuration allows switch 43 to switch between connection and disconnection of low noise amplifier 30 to/from reception filter 61R, switch between connection and disconnection of low noise amplifier 30 to/from reception filter 62R, and switch between connection and disconnection of low noise amplifier 30 to/from reception filter 63R. Switch 43 includes a single pole three throw (SP3T) switch circuit, for example.

Switch 44 is an example of an antenna switch, is connected to antenna connection terminal 100, and switches among (1) connection of antenna connection terminal 100 to transmission path AT and reception path AR, (2) connection of antenna connection terminal 100 to transmission path BT and reception path BR, and (3) connection of antenna connection terminal 100 to transmission path CT and reception path CR. Note that switch 44 includes a multiple connection switch circuit that allows simultaneous connections of at least two of (1) to (3) above.

Note that transmission filters 61T to 63T and reception filters 61R to 63R described above may each be one of, for example, an acoustic wave filter that uses surface acoustic waves (SAWs), an acoustic wave filter that uses bulk acoustic waves (BAWs), an inductor-capacitor (LC) resonance filter, and a dielectric filter, and furthermore, are not limited to those filters.

Matching circuits 51 to 54 are not necessarily included in the radio frequency module according to the present disclosure.

Matching circuits may be disposed between transmission amplifier circuit 10 and switch 42 and between transmission amplifier circuit 20 and switch 42. A diplexer and/or a coupler, for instance, may be disposed between antenna connection terminal 100 and switch 44.

In the configuration of radio frequency module 1, transmission amplifier circuit 10, switch 42, transmission filter 61T, matching circuit 51, and switch 44 are included in a first transmission circuit that transfers transmission signals in communication band A toward antenna connection terminal 100. Further, switch 44, matching circuit 51, reception filter 61R, switch 43, matching circuit 54, and low noise amplifier 30 are included in a first reception circuit that transfers reception signals in communication band A from antenna 2 through antenna connection terminal 100.

Transmission amplifier circuit 10, switch 42, transmission filter 62T, matching circuit 52, and switch 44 are included in a second transmission circuit that transfers transmission signals in communication band B toward antenna connection terminal 100. Further, switch 44, matching circuit 52, reception filter 62R, switch 43, matching circuit 54, and low noise amplifier 30 are included in a second reception circuit that transfers reception signals in communication band B from antenna 2 through antenna connection terminal 100.

Transmission amplifier circuit 20, switch 42, transmission filter 63T, matching circuit 53, and switch 44 are included in a third transmission circuit that transfers transmission signals in communication band C toward antenna connection terminal 100. Further, switch 44, matching circuit 53, reception filter 63R, switch 43, matching circuit 54, and low noise amplifier 30 are included in a third reception circuit that transfers reception signals in communication band C from antenna 2 through antenna connection terminal 100.

According to the above circuit configuration, radio frequency module 1 can carry out at least one of transmission, reception, or transmission and reception of a radio frequency signal in communication band A, B, or C. Furthermore, radio frequency module 1 can carry out at least one of simultaneous transmission, simultaneous reception, or simultaneous transmission and reception of radio frequency signals in communication bands A, B, and C.

Note that in the radio frequency module according to the present disclosure, the three transmission circuits and the three reception circuits may not be connected to antenna connection terminal 100 via switch 44, and may be connected to antenna 2 via different terminals. It is sufficient if the radio frequency module according to the present disclosure includes PA control circuit 80, the first transmission circuit, and the third transmission circuit.

In the radio frequency module according to the present disclosure, it is sufficient if the first transmission circuit includes transmission amplifier circuit 10. It is sufficient if the third transmission circuit includes transmission amplifier circuit 20.

Low noise amplifier 30 and at least one switch out of switches 41 to 44 may be formed in a single semiconductor IC. The semiconductor IC includes a CMOS, for example, and is specifically formed by the SOI process. Accordingly, such a semiconductor IC can be manufactured at a low cost. Note that the semiconductor IC may include at least one of GaAs, SiGe, or GaN. Thus, a radio frequency signal having high amplification quality and high noise quality can be output.

Figure 2:
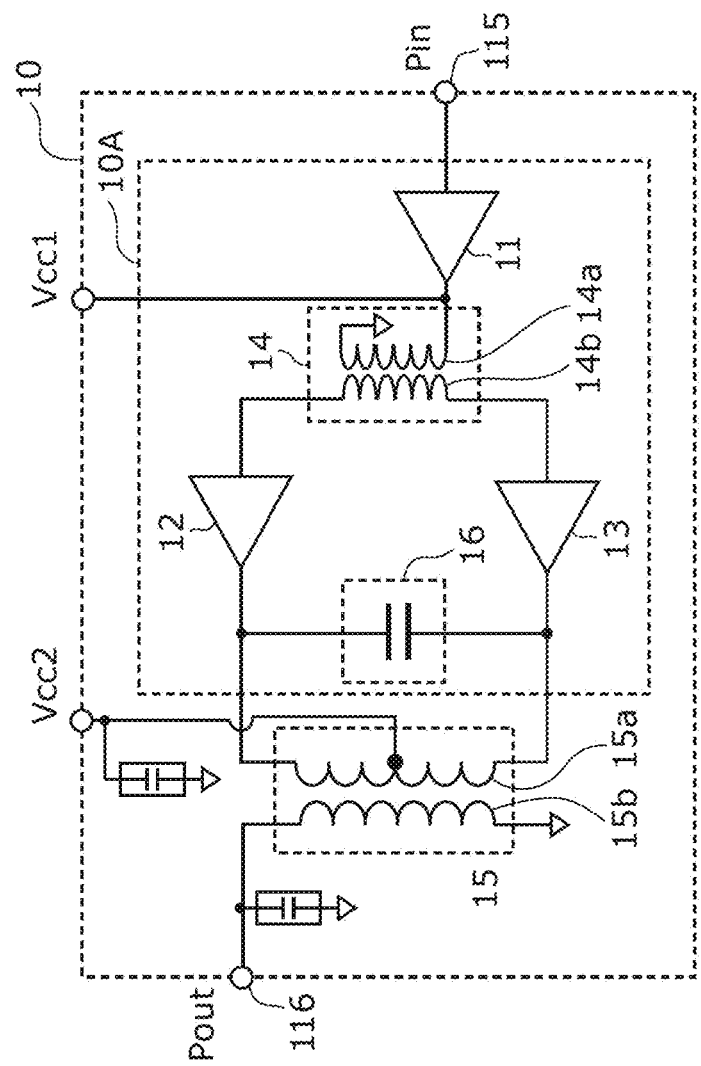
FIG. 2 illustrates a circuit configuration of a transmission amplifier circuit.

FIG. 2 illustrates a circuit configuration of transmission amplifier circuit 10 according to the embodiment. As illustrated in FIG. 2, transmission amplifier circuit 10 includes input terminal 115, output terminal 116, amplifying element 12 (a first amplifying element), amplifying element 13 (a second amplifying element), amplifying element 11 (an upstream amplifying element), interstage transformer (transformer) 14, capacitor 16, and output transformer (unbalance-balance transforming element) 15. Amplifying elements 11 to 13, interstage transformer 14, and capacitor 16 are included in power amplifier 10A. Power amplifier 10A is an example of a first power amplifier.

Interstage transformer 14 includes primary coil 14a and secondary coil 14b.

An input terminal of amplifying element 11 is connected to input terminal 115, and an output terminal of amplifying element 11 is connected to an unbalance terminal of interstage transformer 14. One balance terminal of interstage transformer 14 is connected to an input terminal of amplifying element 12, and another balance terminal of interstage transformer 14 is connected to an input terminal of amplifying element 13.

A radio frequency signal input through input terminal 115 is amplified by amplifying element 11 in a state in which bias voltage Vcc1 is applied to amplifying element 11. Interstage transformer 14 applies an unbalance-balance transform (i.e., a transformation of an unbalanced line to a balanced line that carries non-inverted and inverted versions of the signal) to the amplified radio frequency signal. At this time, a non-inverted input signal is output through the one balance terminal of interstage transformer 14, and an inverted input signal is output through the other balance terminal of interstage transformer 14.

Output transformer 15 is an example of a first output transformer, and includes primary coil (first coil) 15a and secondary coil (second coil) 15b. An end of primary coil 15a is connected to an output terminal of amplifying element 12, and the other end of primary coil 15a is connected to an output terminal of amplifying element 13. Bias voltage Vcc2 is supplied to a middle point of primary coil 15a. One end of secondary coil 15b is connected to output terminal 116, and the other end of secondary coil 15b is connected to the ground. Stated differently, output transformer 15 is connected between (i) output terminal 116 and (ii) the output terminal of amplifying element 12 and the output terminal of amplifying element 13.

Capacitor 16 is connected between the output terminal of amplifying element 12 and the output terminal of amplifying element 13.

Respective impedances of lines that carry a non-inverted input signal amplified by amplifying element 12 and an inverted input signal amplified by amplifying element 13 are transformed by output transformer 15 and capacitor 16 while the signals are maintained in antiphase (or antipodal phase relationship) with each other. Specifically, output transformer 15 and capacitor 16 match the output impedance of power amplifier 10A at output terminal 116 to input impedance of switch 42 and transmission filters 61T and 62T illustrated in FIG. 1. Note that a capacitive element connected between the ground and a path that connects output terminal 116 and secondary coil 15b contributes to the impedance matching. Further note that the capacitive element may be disposed in series on the path that connects output terminal 116 and secondary coil 15b, or optionally need not be included.

Here, amplifying elements 11 to 13, interstage transformer 14, and capacitor 16 constitute power amplifier 10A. In particular, amplifying elements 11 to 13 and interstage transformer 14 are integrally formed in various configurations such as being formed in a single chip or all mounted on a same substrate, for instance. In contrast, output transformer 15 needs to have a high Q factor to handle a high-power transmission signal, and thus is not formed integrally with amplifying elements 11 to 13 or interstage transformer 14, for instance. Stated differently, among circuit components included in transmission amplifier circuit 10, circuit components except output transformer 15 are included in power amplifier 10A.

Note that amplifying element 11 and capacitor 16 are not necessarily included in power amplifier 10A.

According to the circuit configuration of transmission amplifier circuit 10, amplifying elements 12 and 13 operate in antiphase relationship with respect to each other. At this time, fundamental-wave currents flow through amplifying elements 12 and 13 in antiphase with each other, that is, in opposite directions, and thus a resultant fundamental-wave current does not flow into a ground line or a power supply line disposed at a substantially equal distance from amplifying elements 12 and 13. Accordingly, inflow of unnecessary (or undesired) currents to the above lines can be avoided, and thus a decrease in power gain that is experienced in a conventional transmission amplifier circuit can be reduced. Further, a non-inverted signal and an inverted signal amplified by amplifying elements 12 and 13 are combined, and thus noise components superimposed similarly on the signals can be cancelled out, and unnecessary waves such as harmonic components, for example, can be suppressed.

Note that amplifying element 11 is not necessarily included in transmission amplifier circuit 10. An element that transforms an unbalanced input signal into a non-inverted input signal and an inverted input signal is not limited to interstage transformer 14. Capacitor 16 is optional for impedance matching.

Although not illustrated, transmission amplifier circuit 20 has a similar circuit configuration to that of transmission amplifier circuit 10 illustrated in FIG. 2. Specifically, transmission amplifier circuit 20 includes input terminal 125, output terminal 126, amplifying element 22 (a third amplifying element), amplifying element 23 (a fourth amplifying element), amplifying element 21 (an upstream amplifying element), interstage transformer (transformer) 24, capacitor 26, and output transformer (unbalance-balance transforming element) 25. Amplifying elements 21 to 23, interstage transformer 24, and capacitor 26 are included in power amplifier 20A. Power amplifier 20A is an example of a second power amplifier.

Interstage transformer 24 includes primary coil 24a and secondary coil 24b.

An input terminal of amplifying element 21 is connected to input terminal 125, and an output terminal of amplifying element 21 is connected to an unbalance terminal of interstage transformer 24. One balance terminal of interstage transformer 24 is connected to an input terminal of amplifying element 22, and another balance terminal of interstage transformer 24 is connected to an input terminal of amplifying element 23.

Output transformer 25 is an example of a second output transformer, and includes primary coil (third coil) 25a and secondary coil (fourth coil) 25b. One end of primary coil 25a is connected to an output terminal of amplifying element 22, and the other end of primary coil 25a is connected to an output terminal of amplifying element 23. Bias voltage Vcc2 is supplied to a middle point of primary coil 25a. One end of secondary coil 25b is connected to output terminal 126, and the other end of secondary coil 25b is connected to the ground. Stated differently, output transformer 25 is connected between (i) output terminal 126 and (ii) the output terminal of amplifying element 22 and the output terminal of amplifying element 23.

Capacitor 26 is connected between the output terminal of amplifying element 22 and the output terminal of amplifying element 23.

Here, amplifying elements 21 to 23, interstage transformer 24, and capacitor 26 constitute power amplifier 20A. In particular, amplifying elements 21 to 23 and interstage transformer 24 are integrally formed in various configurations such as being formed in a single chip or all mounted on a same substrate, for instance. On the other hand, output transformer 25 is not integrally formed with amplifying elements 21 to 23 or interstage transformer 24, for instance.

Note that amplifying element 21 and capacitor 26 are not necessarily included in power amplifier 20A.

According to the circuit configuration of transmission amplifier circuit 20, a decrease in power gain that is seen in a conventional transmission amplifier circuit can be reduced. Further, a non-inverted signal and an inverted signal amplified by amplifying elements 22 and 23 are combined, and thus noise components superimposed similarly on the signals can be cancelled out, and unnecessary waves such as harmonic components, for example, can be decreased.

Note that amplifying element 21 is not necessarily included in transmission amplifier circuit 20. An element that transforms an unbalanced input signal into a non-inverted input signal and an inverted input signal is not limited to interstage transformer 24. Capacitor 26 is optional for impedance matching.

Amplifying elements 11 to 13 and 21 to 23 and low noise amplifier 30 each include a field effect transistor (FET) or a hetero-bipolar transistor (HBT) made of a silicon-based CMOS or GaAs, for example.

Note that transmission amplifier circuit 10 may not include difference amplifying type power amplifier 10A, and may be an amplifier that includes a so-called single-ended amplifying element that receives an unbalanced signal, and outputs an unbalanced signal. Further, transmission amplifier circuit 20 may not include difference amplifying type power amplifier 20A, and may be an amplifier that includes a so-called single-ended amplifying element that receives an unbalanced signal, and outputs an unbalanced signal.

Here, in radio frequency module 1, transmission amplifier circuit 10 amplifies transmission signals in communication bands A and B, and transmission amplifier circuit 20 amplifies a transmission signal in communication band C. Accordingly, amplification performance of transmission amplifier circuits 10 and 20 is optimized in a specific frequency band (a communication band), and thus radio frequency module 1 needs to include a plurality of transmission amplifier circuits to handle signals in frequency bands (communication bands). Development in multiband technology that radio frequency module 1 supports brings a problem that the size of radio frequency module 1 increases due to an increase in the number of transmission amplifier circuits disposed. If the elements are mounted densely for size reduction, a high-power transmission signal output from a transmission amplifier circuit interferes with a circuit component included in radio frequency module 1, which leads to a problem that the quality of a radio frequency signal output from radio frequency module 1 deteriorates.

To address this, the following describes a configuration of small radio frequency module 1 in which deterioration in quality of radio frequency signals output from radio frequency module 1 is reduced.

[2. Arrangement of Circuit Elements of Radio Frequency Module 1A According to Example 1]

Figure 3A:
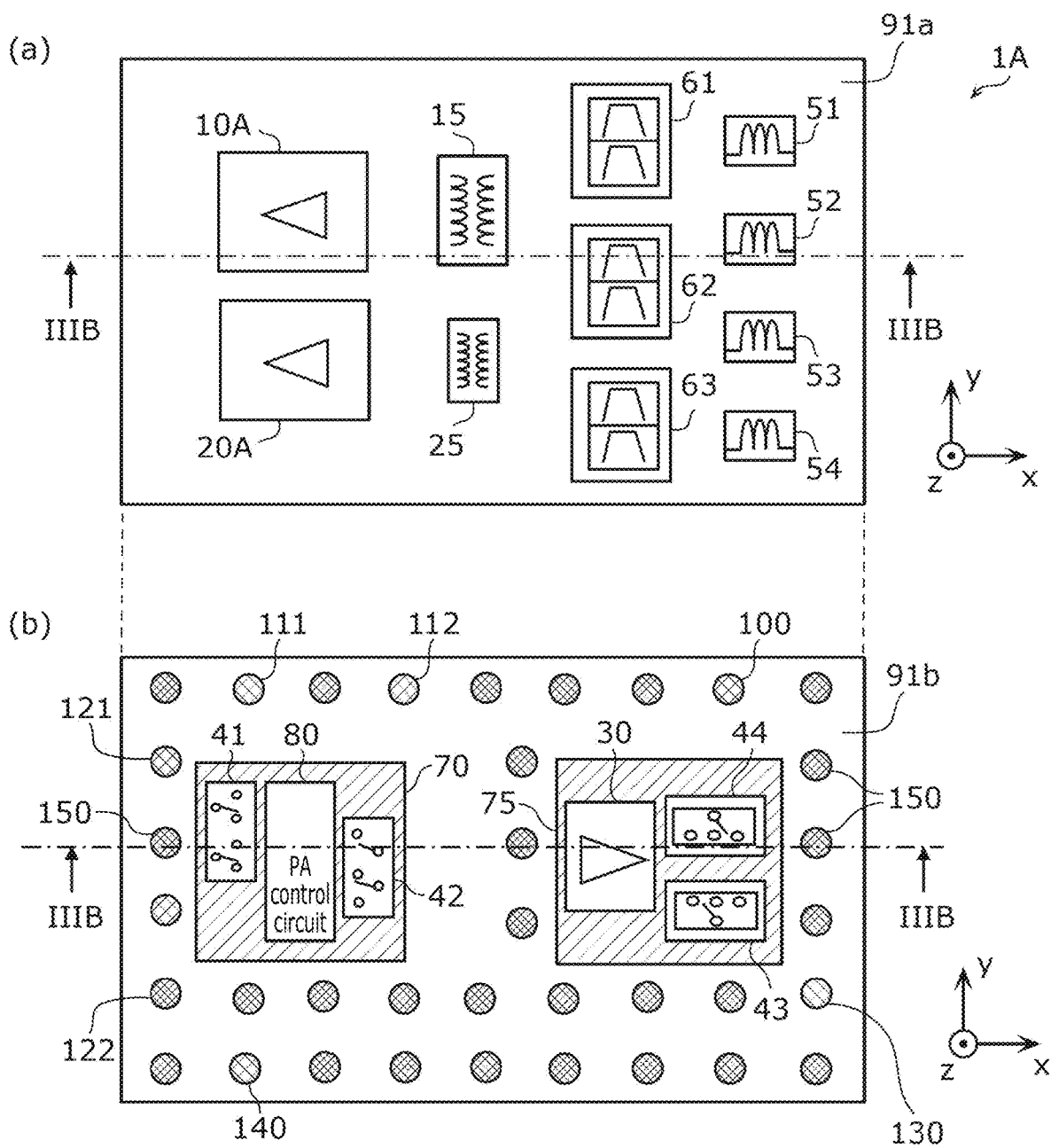
FIG. 3A is a schematic diagram illustrating a planar configuration of a radio frequency module (or RF front-end circuitry) according to Example 1.
Figure 3B:
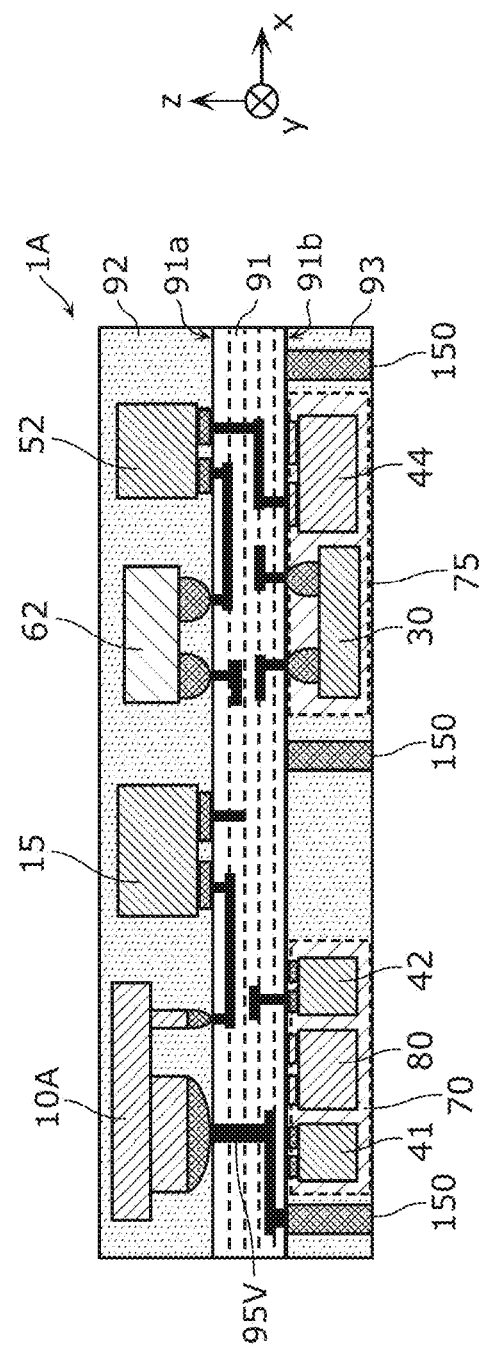
FIG. 3B is a schematic diagram illustrating a cross-sectional configuration of the radio frequency module according to Example 1.

FIG. 3A is a schematic diagram illustrating a planar configuration of radio frequency module 1A according to Example 1. FIG. 3B is a schematic diagram illustrating a cross-sectional configuration of radio frequency module 1A according to Example 1, and specifically, illustrates a cross section taken along line IIIB to IIIB in FIG. 3A. Note that (a) of FIG. 3A illustrates a layout of circuit elements when principal surface 91a out of principal surfaces 91a and 91b on opposite sides of module board 91 is viewed from the positive z-axis. On the other hand, (b) of FIG. 3A is a perspective view of a layout of circuit elements when principal surface 91b is viewed from the positive z-axis.

Radio frequency module 1A according to Example 1 shows a specific arrangement of circuit elements included in radio frequency module 1 according to the embodiment.

As illustrated in FIGS. 3A and 3B, radio frequency module 1A according to this example further includes module board 91, resin members 92 and 93, and external-connection terminals 150, in addition to the circuit configuration illustrated in FIG. 1.

Module board 91 is a board which includes principal surface 91a (a first principal surface) and principal surface 91b (a second principal surface) on opposite sides of module board 91, and on which the transmission circuits and the reception circuits described above are mounted. As module board 91, one of a low temperature co-fired ceramics (LTCC) board, a high temperature co-fired ceramics (HTCC) board, a component-embedded board, a board that includes a redistribution layer (RDL), and a printed circuit board, each having a stacked structure of a plurality of dielectric layers, is used, for example.

Resin member 92 is provided on principal surface 91a of module board 91, covers at least partially the transmission circuits, at least partially the reception circuits, and principal surface 91a of module board 91, and has a function of ensuring reliability of mechanical strength and moisture resistance, for instance, of the circuit elements included in the transmission circuits and the reception circuits. Resin member 93 is provided on principal surface 91b of module board 91, covers at least partially the transmission circuits, at least partially the reception circuits, and principal surface 91b of module board 91, and has a function of ensuring reliability of mechanical strength and moisture resistance, for instance, of the circuit elements included in the transmission circuits and the reception circuits. Note that resin members 92 and 93 are not necessarily included in the radio frequency module according to the present disclosure.

As illustrated in FIGS. 3A and 3B, in radio frequency module 1A according to this example, power amplifiers 10A and 20A, output transformers 15 and 25, duplexers 61, 62, and 63, and matching circuits 51, 52, 53, and 54 are disposed on principal surface 91a (the first principal surface) of module board 91. On the other hand, PA control circuit 80, low noise amplifier 30, and switches 41, 42, 43, and 44 are disposed on principal surface 91b (the second principal surface) of module board 91.

Note that although not illustrated in FIG. 3A, lines that extend as transmission paths AT, BT, and CT and reception paths AR, BR, and CR illustrated in FIG. 1 are formed inside of module board 91 and on principal surfaces 91a and 91b. The lines may each be a bonding wire having two ends each joined to any of principal surfaces 91a and 91b and circuit elements included in radio frequency module 1A, or may each be a terminal, an electrode, or a line formed on a surface of a circuit element included in radio frequency module 1A.

Thus, in this example, power amplifiers 10A and 20A are mounted on principal surface 91a (the first principal surface). On the other hand, switch 42 is mounted on principal surface 91b (the second principal surface). Power amplifier 10A is an example of a first power amplifier that amplifies a transmission signal in the first frequency band that includes communication bands A and B, and power amplifier 20A is an example of a second power amplifier that amplifies a transmission signal in the second frequency band that includes communication band C. In this example, the first frequency band (communication bands A and B) may be lower than the second frequency band (communication band C), and the first frequency band (communication bands A and B) may be higher than the second frequency band (communication band C).

According to the above configuration of radio frequency module 1A according to this example, power amplifiers 10A and 20A and switch 42 that passes output signals from power amplifiers 10A and 20A are mounted on the two sides, and thus radio frequency module 1A can be miniaturized. Switch 42 that has off-capacitance between a common terminal and a selection terminal that are not connected and power amplifiers 10A and 20A are disposed with module board 91 being located therebetween. Accordingly, transmission signals output from power amplifiers 10A and 20A can be prevented from leaking to an unconnected transmission or reception path via the off-capacitance. Consequently, deterioration in the quality of radio frequency signals output from power amplifiers 10A and 20A can be reduced.

Furthermore, power amplifier 10A includes at least amplifying elements 11 to 13 and interstage transformer 14, and power amplifier 20A includes at least amplifying elements 21 to 23 and interstage transformer 24. Consequently, the number of circuit elements increases, resulting in a larger mounting area. The size of radio frequency module 1A thus tends to be increased. When transmission amplifier circuits 10 and 20 are difference amplifying type amplifier circuits, a configuration in which power amplifiers 10A and 20A and switch 42 are separately disposed on the two sides of module board 91 greatly contributes to reduction in the size of radio frequency module 1A.

In radio frequency module 1A according to this example, in a plan view of module board 91, desirably, a footprint of power amplifier 10A at least partially overlaps a footprint of switch 42, and a footprint of power amplifier 20A at least partially overlaps the footprint of switch 42.

According to this configuration, a transmission signal line that connects power amplifier 10A and switch 42 and a transmission signal line that connects power amplifier 20A and switch 42 can be shortened, and thus transfer loss of transmission signals can be reduced.

Note that output transformers 15 and 25, duplexers 61 to 63, and matching circuits 51 to 54 are mounted on principal surface 91a (the first principal surface), but may be mounted on principal surface 91b (the second principal surface). Low noise amplifier 30, PA control circuit 80, and switches 41, 43, and 44 are mounted on principal surface 91b (the second principal surface), but may be mounted on principal surface 91a (the first principal surface).

Note that desirably, module board 91 has a multilayer structure in which a plurality of dielectric layers are stacked, and a ground electrode pattern is formed on at least one of the dielectric layers. Accordingly, the electromagnetic field shielding function of module board 91 improves.

In radio frequency module 1A according to this example, external-connection terminals 150 are disposed on principal surface 91b (the second principal surface) of module board 91. Radio frequency module 1A exchanges electrical signals with a motherboard disposed on the negative z-axis side of radio frequency module 1A, via external-connection terminals 150. As illustrated in (b) of FIG. 3A, the external-connection terminals include antenna connection terminal 100, transmission input terminals 111, 112, 121, and 122, reception output terminal 130, and control signal terminal 140. Potentials of some of external-connection terminals 150 are set to the ground potential of the motherboard. On principal surface 91b that faces the motherboard out of principal surfaces 91a and 91b, power amplifiers 10A and 20A whose heights are not readily decreased are not disposed, and low noise amplifier 30, PA control circuit 80, and switches 41 to 44 whose heights are readily decreased are disposed, and thus the height of radio frequency module 1A as a whole can be decreased.

In radio frequency module 1A according to this example, power amplifiers 10A and 20A are disposed on principal surface 91a, and low noise amplifier 30 is disposed on principal surface 91b. According to this, power amplifiers 10A and 20A that amplify transmission signals and low noise amplifier 30 that amplifies a reception signal are separately disposed on the two sides, and thus isolation between transmission and reception can be improved.

Further, as illustrated in FIGS. 3A and 3B, external-connection terminals 150 having the ground potential are disposed between low noise amplifier 30 and switch 42 disposed on principal surface 91b (the second principal surface), in a plan view of module board 91.

According to this configuration, plural external-connection terminals 150 used as ground electrodes are disposed between low noise amplifier 30 that greatly affects reception sensitivity of the reception circuits and switch 42 that passes high-power transmission signals, and thus deterioration in reception sensitivity due to transmission signals and harmonics thereof, for instance, can be reduced.

Power amplifiers 10A and 20A are components that generate a great amount of heat, out of circuit components included in radio frequency module 1A. In order to improve heat dissipation of radio frequency module 1A, it is important to dissipate heat generated by power amplifiers 10A and 20A to the motherboard through heat dissipation paths having low heat resistance. If power amplifiers 10A and 20A are mounted on principal surface 91b, electrode lines connected to power amplifiers 10A and 20A are disposed on principal surface 91b. Accordingly, the heat dissipation paths include a heat dissipation path along only a planar line pattern (in the xy plane direction) on principal surface 91b. The planar line pattern is formed of a thin metal film, and thus has high heat resistance. Accordingly, if power amplifiers 10A and 20A are disposed on principal surface 91b, heat dissipation deteriorates.

To address this, radio frequency module 1A according to this example further includes heat-dissipating via-conductor 95V that is connected, on principal surface 91a, to a ground electrode of power amplifier 10A, and extends from principal surface 91a to principal surface 91b, as illustrated in FIG. 3B. Heat-dissipating via-conductor 95V is connected, on principal surface 91b, to external-connection terminal 150 having the ground potential out of external-connection terminals 150.

According to this configuration, when power amplifier 10A is mounted on principal surface 91a, power amplifier 10A and external-connection terminal 150 can be connected through heat-dissipating via-conductor 95V. Accordingly, as heat dissipation paths for power amplifier 10A, a heat dissipation path extending along only a planar line pattern in the xy plane direction and having high heat resistance can be excluded from lines on and in module board 91. Thus, miniaturized radio frequency module 1A having improved heat dissipation from power amplifier 10A to the motherboard can be provided.

Note that FIG. 3B illustrates, as an example, a configuration in which power amplifier 10A, heat-dissipating via-conductor 95V, and external-connection terminal 150 are connected, yet radio frequency module 1A may have a configuration in which power amplifier 20A, heat-dissipating via-conductor 95V, and external-connection terminal 150 are connected. Accordingly, miniaturized radio frequency module 1A having improved heat dissipation from power amplifier 20A to the motherboard can be provided.

In radio frequency module 1A according to this example, output transformers 15 and 25 are disposed on principal surface 91a, but may be disposed on principal surface 91b or inside of module board 91. When output transformers 15 and 25 are disposed inside of module board 91, inductors included in output transformers 15 and 25 are planar coils formed by electric conduction patterns of module board 91, for example. In such arrangement of output transformers 15 and 25, footprints of power amplifiers 10A and 20A desirably do not overlap footprints of output transformers 15 and 25, in a plan view of module board 91.

Output transformers 15 and 25 each need to have a high Q factor to handle a high-power transmission signal, and thus desirably, magnetic fields formed by output transformers 15 and 25 do not change due to power amplifiers 10A and 20A being adjacent thereto. Power amplifiers 10A and 20A are not disposed in regions where the transformers are disposed, and thus the Q factors of the inductors included in output transformers 15 and 25 can be maintained high.

In radio frequency module 1A according to this example, as illustrated in FIGS. 3A and 3B, desirably, output transformers 15 and 25 are disposed on principal surface 91a, and in a plan view of module board 91, no circuit component is disposed in a region included in principal surface 91b and overlapping a footprint of output transformer 15, and no circuit component is disposed in a region included in principal surface 91b and overlapping a footprint of output transformer 25. Output transformers 15 and 25 are surface mount chip elements each including a plurality of inductors, for example. Furthermore, output transformers 15 and 25 may be, for example, integrated passive devices (IPDs) in each of which one or more passive elements such as an inductor are mounted inside of or on the surface of a silicon substrate in an integrated manner. When output transformers 15 and 25 are IPDs, radio frequency module 1A can be further miniaturized.

Output transformers 15 and 25 each need to have a high Q factor to handle a high-power transmission signal, and thus desirably, magnetic fields formed by output transformers 15 and 25 do not change due to other circuit components being adjacent thereto. No circuit component is formed in regions where the transformers are disposed, and thus the Q factors of the inductors included in output transformers 15 and 25 can be maintained high.

Furthermore, in a plan view of module board 91, desirably, a ground electrode layer is not formed in a region included in module board 91 and overlapping formation regions in which output transformers 15 and 25 are formed. According to this configuration, it can be ensured that output transformers 15 and 25 are widely spaced apart from ground electrodes, and thus the Q factors of the inductors included in output transformers 15 and 25 can be maintained high.

The formation regions in which output transformers 15 and 25 are formed are defined as follows. Note that the following describes the formation region in which output transformer 15 is formed, yet the definition of the formation region in which output transformer 25 is formed is the same as that of the formation region in which output transformer 15 is formed, and thus defining the formation region in which output transformer 25 is formed is omitted.

The formation region in which output transformer 15 is formed is a minimum region that includes a formation region in which primary coil 15a is formed and a formation region in which secondary coil 15b is formed, in a plan view of module board 91.

Here, secondary coil 15b is defined as a line conductor disposed along primary coil 15a, in a section in which a first distance from primary coil 15a is substantially constant. At this time, portions of the line conductor located on both sides of the above section are spaced apart from primary coil 15a by a second distance longer than the first distance, and one end and the other end of secondary coil 15b are points at which a distance from the line conductor to primary coil 15a changes from the first distance to the second distance. Primary coil 15a is defined as a line conductor disposed along secondary coil 15b, in a section in which the first distance from secondary coil 15b is substantially constant. At this time, portions of the line conductor located on both sides of the above section are spaced apart from secondary coil 15b by the second distance longer than the first distance, and one end and the other end of primary coil 15a are points at which a distance from the line conductor to secondary coil 15b changes from the first distance to the second distance.

Alternatively, secondary coil 15b is defined as a line conductor disposed along primary coil 15a, in a first section in which the line width is a substantially constant first width. Primary coil 15a is defined as a line conductor disposed along secondary coil 15b, in the first section in which the line width is the substantially constant first width.

Alternatively, secondary coil 15b is defined as a line conductor disposed along primary coil 15a, in a first section in which the thickness is a substantially constant first thickness. Primary coil 15a is defined as a line conductor disposed along secondary coil 15b, in the first section in which the thickness is the substantially constant first thickness.

Alternatively, secondary coil 15b is defined as a line conductor disposed along primary coil 15a, in a first section in which a degree of coupling with primary coil 15a is a substantially constant first degree of coupling. Further, primary coil 15a is defined as a line conductor disposed along secondary coil 15b, in the first section in which a degree of coupling with secondary coil 15b is the substantially constant first degree of coupling.

Figure 4A:
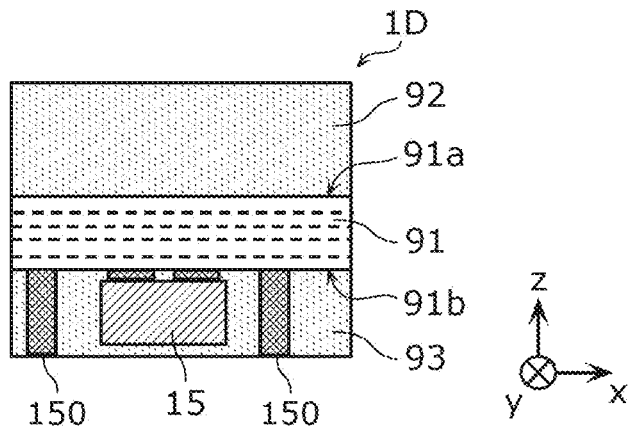
FIG. 4A is a schematic diagram illustrating a cross-sectional configuration of an output transformer according to Variation 1.

FIG. 4A is a schematic diagram of a cross-sectional configuration illustrating the position of output transformer 15 in radio frequency module 1D according to Variation 1. FIG. 4A illustrates the position of output transformer 15 in the cross-sectional configuration of radio frequency module 1D according to Variation 1. Note that the arrangement of circuit components included in radio frequency module 1D other than output transformers 15 and 25 is the same as that of radio frequency module 1A according to Example 1. In radio frequency module 1D, output transformers 15 and 25 are disposed on principal surface 91b. In this case, desirably, no circuit component is disposed in regions included in principal surface 91a and overlapping the formation regions in which output transformers 15 and 25 are formed, in a plan view of module board 91.

According to this configuration, no circuit component is disposed in the above regions in principal surface 91a, and thus decreases in the Q factors of the inductors of output transformers 15 and 25 can be reduced.

Figure 4B:
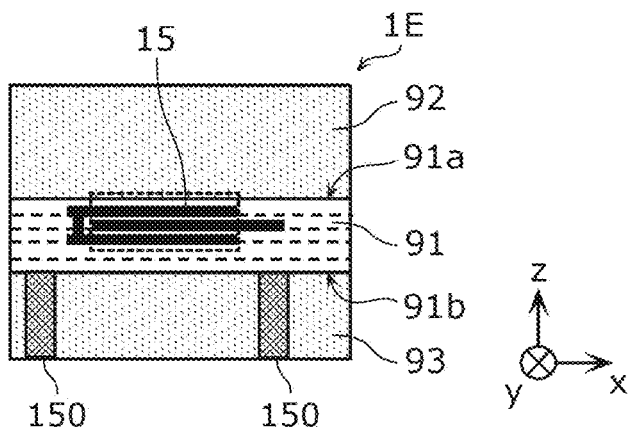
FIG. 4B is a schematic diagram illustrating a cross-sectional configuration of an output transformer according to Variation 2.

FIG. 4B is a schematic diagram of a cross-sectional configuration illustrating the position of output transformer 15 in radio frequency module 1E according to Variation 2. FIG. 4B illustrates the position of output transformer 15 in the cross-sectional configuration of radio frequency module 1E according to Variation 2. Note that the arrangement of circuit components included in radio frequency module 1E other than output transformers 15 and 25 is the same as that of radio frequency module 1A according to Example 1. In radio frequency module 1E, output transformers 15 and 25 are formed inside of module board 91, between principal surface 91a and principal surface 91b, and are offset toward principal surface 91a. In this case, in a plan view of module board 91, no circuit component is disposed in a region included in principal surface 91a and overlapping the formation regions in which output transformers 15 and 25 are formed, and a circuit component may be disposed in a region included in principal surface 91b and overlapping the formation regions in which output transformers 15 and 25 are formed.

Also in this case, no circuit component is disposed in the above regions in principal surface 91a closer to output transformers 15 and 25, and thus decreases in the Q factors of the inductors of output transformers 15 and 25 can be reduced.

Figure 4C:
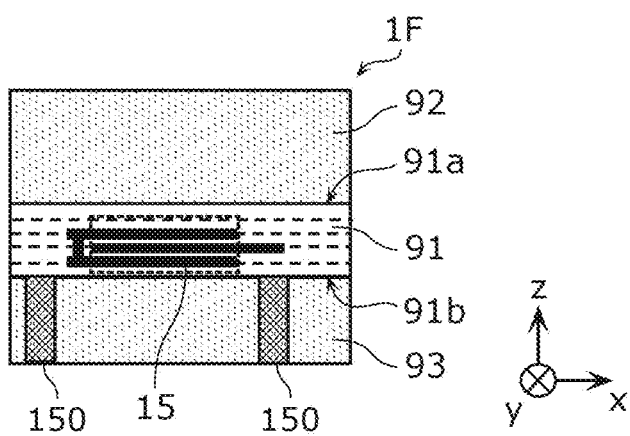
FIG. 4C is a schematic diagram illustrating a cross-sectional configuration of an output transformer according to Variation 3.

FIG. 4C is a schematic diagram of a cross-sectional configuration illustrating the position of output transformer 15 in radio frequency module 1F according to Variation 3. FIG. 4C illustrates the position of output transformer 15 in the cross-sectional configuration of radio frequency module 1F according to Variation 3. Note that the arrangement of circuit components included in radio frequency module 1F other than output transformers 15 and 25 is the same as that of radio frequency module 1A according to Example 1. In radio frequency module 1F, output transformers 15 and 25 are formed inside of module board 91, between principal surface 91a and principal surface 91b, and are offset toward principal surface 91b. In this case, in a plan view of module board 91, no circuit component is disposed in regions included in principal surface 91b and overlapping the formation regions in which output transformers 15 and 25 are formed, and one or more circuit components (not illustrated) may be disposed in regions included in principal surface 91a and overlapping the formation regions in which output transformers 15 and 25 are formed.

Also in this case, no circuit component is disposed in the above regions in principal surface 91b closer to output transformers 15 and 25, and thus decreases in the Q factors of the inductors of output transformers 15 and 25 can be reduced.

Note that in each of radio frequency module 1E illustrated in FIG. 4B and radio frequency module 1F illustrated in FIG. 4C, in a plan view of module board 91, more desirably, no circuit component is disposed in regions included in both principal surfaces 91a and 91b and overlapping footprints of output transformers 15 and 25.

According to this configuration, decreases in the Q factors of the inductors of output transformers 15 and 25 can be further reduced.

In radio frequency module 1A according to this example, power amplifiers 10A and 20A are disposed on principal surface 91a, and switch 42 is disposed on principal surface 91b, yet power amplifiers 10A and 20A may be disposed on principal surface 91b, and switch 42 may be disposed on principal surface 91a. This configuration also allows power amplifiers 10A and 20A and switch 42 to be mounted on the two sides, and thus radio frequency module 1A can be miniaturized. Switch 42 that has off-capacitance between a common terminal and a selection terminal that are not connected and power amplifiers 10A and 20A are disposed with module board 91 being located therebetween. Accordingly, transmission signals output from power amplifiers 10A and 20A can be prevented from leaking to an unconnected transmission or reception path via the off-capacitance. Consequently, deterioration in the quality of radio frequency signals output from power amplifiers 10A and 20A can be reduced.

In radio frequency module 1A according to this example, power amplifiers 10A and 20A are disposed on principal surface 91a (the first principal surface). On the other hand, PA control circuit 80 is mounted on principal surface 91b (the second principal surface).

According to this configuration, power amplifiers 10A and 20A, and PA control circuit 80 that controls power amplifiers 10A and 20A are mounted on the two sides, and thus radio frequency module 1A can be miniaturized. PA control circuit 80 that receives and outputs digital control signals and power amplifiers 10A and 20A are disposed with module board 91 being located therebetween, and thus power amplifiers 10A and 20A can be prevented from receiving digital noise. Accordingly, deterioration in the quality of radio frequency signals output from power amplifiers 10A and 20A can be reduced.

In radio frequency module 1A according to this example, PA control circuit 80 and switches 41 and 42 are included in single semiconductor IC 70, and semiconductor IC 70 is disposed on principal surface 91b. Accordingly, PA control circuit 80 connected to transmission amplifier circuits 10 and 20 is adjacent to switches 41 and 42, and thus radio frequency module 1A can be miniaturized. A control line that connects PA control circuit 80 and switch 41 and a control line that connects PA control circuit 80 and switch 42 can be shortened, and thus noise generated from the control lines can be reduced.

Note that semiconductor IC 70 may not include at least one switch out of switches 41 and 42.

In radio frequency module 1A according to this example, low noise amplifier 30 and switches 43 and 44 are included in single semiconductor IC 75, and semiconductor IC 75 is disposed on principal surface 91b. Accordingly, low noise amplifier 30 and switches 43 and 44 disposed on the reception paths are adjacent to one another, and thus radio frequency module 1A can be miniaturized.

Note that semiconductor IC 75 may not include at least one switch out of switches 43 and 44.

Figure 5:
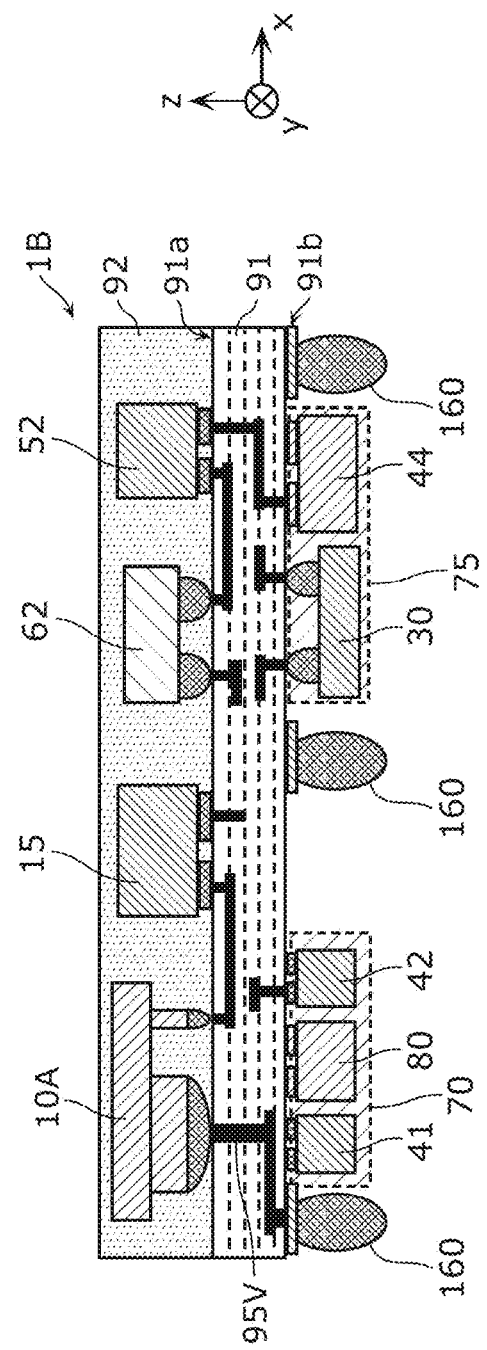
FIG. 5 is a schematic diagram illustrating a cross-sectional configuration of a radio frequency module according to Variation 4.

Note that external-connection terminals 150 may be columnar electrodes passing through resin member 93 in the z-axis direction as illustrated in FIGS. 3A and 3B, or may be bump electrodes 160 formed on principal surface 91b as in radio frequency module 1B according to Variation 4 illustrated in FIG. 5. In this case, resin member 93 may not be provided on principal surface 91b.

In each of radio frequency module 1A according to Example 1 and radio frequency modules 1D to 1F according to Variations 1 to 3, external-connection terminals 150 may be disposed on principal surface 91a. In radio frequency module 1B according to Variation 4, bump electrodes 160 may be disposed on principal surface 91a.

[3. Arrangement of Circuit Elements of Radio Frequency Module 1C According to Example 2]

Figure 6:
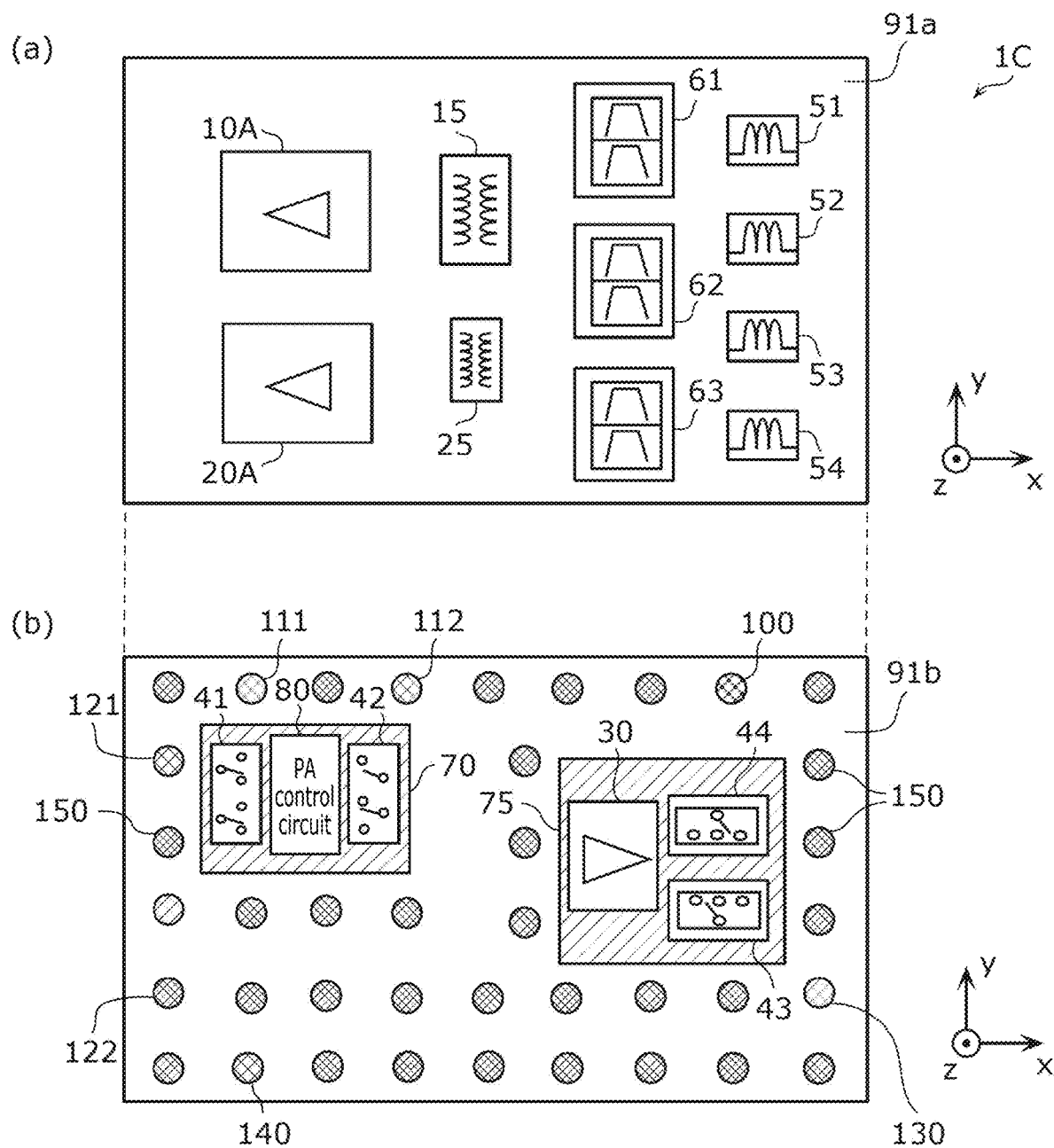
FIG. 6 is a schematic diagram illustrating a planar configuration of a radio frequency module according to Example 2.

FIG. 6 is a schematic diagram illustrating a planar configuration of radio frequency module 1C according to Example 2. Note that (a) of FIG. 6 illustrates a layout of circuit elements when principal surface 91a out of principal surfaces 91a and 91b on opposite sides of module board 91 is viewed from the positive z-axis. On the other hand, (b) of FIG. 6 is a perspective view of a layout of circuit elements when principal surface 91b is viewed from the positive z-axis.

Radio frequency module 1C according to Example 2 shows a specific arrangement of circuit elements included in radio frequency module 1 according to the embodiment.

Radio frequency module 1C according to this example is different from radio frequency module 1A according to Example 1, only in the location of semiconductor IC 70. The following description of radio frequency module 1C according to this example focuses on differences from radio frequency module 1A according to Example 1 while a description of the same points is omitted.

As illustrated in FIG. 6, in radio frequency module 1C according to this example, power amplifiers 10A and 20A, output transformers 15 and 25, duplexers 61, 62, and 63, and matching circuits 51, 52, 53, and 54 are disposed on principal surface 91a (the first principal surface) of module board 91. On the other hand, PA control circuit 80, low noise amplifier 30, and switches 41, 42, 43, and 44 are disposed on principal surface 91b (the second principal surface) of module board 91.

Thus, in this example, power amplifiers 10A and 20A are mounted on principal surface 91a (the first principal surface). On the other hand, switch 42 is mounted on principal surface 91b (the second principal surface).

Power amplifier 10A is an example of a first power amplifier that amplifies a transmission signal in the first frequency band that includes communication bands A and B, and power amplifier 20A is an example of a second power amplifier that amplifies a transmission signal in the second frequency band that includes communication band C. In this example, the first frequency band (communication bands A and B) is lower than the second frequency band (communication band C).

In radio frequency module 1C according to this example, in a plan view of module board 91, the footprint of power amplifier 10A at least partially overlaps the footprint of switch 42, and the footprint of power amplifier 20A does not overlap the footprint of switch 42.

Out of power amplifiers 10A and 20A, power amplifier 20A that amplifies a transmission signal having a higher frequency consumes more power. Thus, a heat dissipation member such as heat-dissipating via-conductor 95V is desirably disposed in a region included in principal surface 91b that overlaps the footprint of power amplifier 20A. On the other hand, from a viewpoint of reducing transfer loss of transmission signals in signal lines that connect power amplifiers 10A and 20A and switch 42, the signal lines are desirably short.

According to the above configuration, the control line can be shortened since the footprint of power amplifier 10A at least partially overlaps the footprint of switch 42, and the footprint of power amplifier 20A does not overlap the footprint of switch 42 so that switch 42 can be prevented from being damaged by heat dissipated from power amplifier 20A while heat dissipation of power amplifier 20A improves.

In radio frequency module 1C according to this example, as illustrated in FIG. 6, output transformer 15 is larger than output transformer 25. Note that "output transformer 15 is larger than output transformer 25" means that the volume of output transformer 15 is greater than the volume of output transformer 25. In the above relation in which the volume of output transformer 15 is greater than that of output transformer 25, the footprint of power amplifier 10A at least partially overlaps the footprint of switch 42, and the footprint of power amplifier 20A does not overlap the footprint of switch 42.

Out of output transformers 15 and 25, output transformer 25 that outputs a transmission signal having a higher frequency has a smaller volume. According to the above configuration, the control line can be shortened since the footprint of power amplifier 10A at least partially overlaps the footprint of switch 42, and the footprint of power amplifier 20A does not overlap the footprint of switch 42 so that switch 42 can be prevented from being damaged by heat dissipated from power amplifier 20A while heat dissipation of power amplifier 20A improves.

[4. Advantageous Effects and Others]

As described above, radio frequency module 1 according to the present embodiment includes: module board 91 that includes principal surfaces 91a and 91b on opposite sides of module board 91; power amplifier 10A configured to amplify a transmission signal in a first frequency band; power amplifier 20A configured to amplify a transmission signal in a second frequency band different from the first frequency band; and switch 42 connected to an output terminal of power amplifier 10A and an output terminal of power amplifier 20A. Power amplifiers 10A and 20A are disposed on principal surface 91a, and switch 42 is disposed on principal surface 91b.

According to this configuration, power amplifiers 10A and 20A, and switch 42 that passes output signals from amplifiers 10A and 20A are mounted on the two sides, and thus radio frequency module 1A can be miniaturized. Switch 42 that has off-capacitance between a common terminal and a selection terminal that are not connected and power amplifiers 10A and 20A are disposed with module board 91 being located therebetween. Accordingly, transmission signals output from power amplifiers 10A and 20A can be prevented from leaking to an unconnected transmission or reception path via the off-capacitance. Consequently, deterioration in the quality of radio frequency signals output from power amplifiers 10A and 20A can be reduced.

Radio frequency module 1 further includes transmission filters 61T and 62T, and switch 42 is configured to switch at least connection of power amplifier 10A between transmission filter 61T and transmission filter 62T.

Radio frequency module 1 may further include a plurality of external-connection terminals 150 disposed on principal surface 91b.

Accordingly, on principal surface 91b that faces a motherboard out of principal surfaces 91a and 91b, power amplifiers 10A and 20A whose heights are not readily decreased are not disposed, and switch 42 whose height is readily decreased is disposed, and thus the height of radio frequency module 1 as a whole can be decreased.

Radio frequency module 1 may further include heat-dissipating via-conductor 95V connected to at least one of ground electrodes of power amplifiers 10A and 20A, heat-dissipating via-conductor 95V extending from principal surface 91a to principal surface 91b. Heat-dissipating via-conductor 95V may be connected, on principal surface 91b, to an external-connection terminal having a ground potential out of external-connection terminals 150.

According to this configuration, when power amplifier 10A is mounted on principal surface 91a, power amplifier 10A and external-connection terminal 150 can be connected through heat-dissipating via-conductor 95V. Accordingly, as heat dissipation paths for power amplifier 10A, a heat dissipation path extending along only a planar line pattern in the xy plane direction and having high heat resistance can be excluded from lines on and in module board 91. Thus, miniaturized radio frequency module 1 having improved heat dissipation from power amplifier 10A to the motherboard can be provided.

Radio frequency module 1 may further include low noise amplifier 30 disposed on principal surface 91b and configured to amplify a reception signal. In a plan view of module board 91, an external-connection terminal having a ground potential may be disposed between switch 42 and low noise amplifier 30, out of external-connection terminals 150.

According to this configuration, plural external-connection terminals 150 used as ground electrodes are disposed between low noise amplifier 30 that greatly affects reception sensitivity of the reception circuits and switch 42 that passes high-power transmission signals, and thus deterioration in reception sensitivity due to transmission signals and harmonics thereof can be reduced.

In radio frequency module 1A, in a plan view of module board 91, the footprint of power amplifier 10A may at least partially overlap the footprint of switch 42, and the footprint of power amplifier 20A may at least partially overlap the footprint of switch 42.

According to this configuration, a transmission signal line that connects power amplifier 10A and switch 42 and a transmission signal line that connects power amplifier 20A and switch 42 can be shortened, and thus transfer loss of transmission signals can be reduced.

In radio frequency module 1C, the first frequency band is lower than the second frequency band, and in a plan view of module board 91, the footprint of power amplifier 10A may at least partially overlap the footprint of switch 42, and the footprint of power amplifier 20A may not overlap the footprint of switch 42.

Out of power amplifiers 10A and 20A, power amplifier 20A that amplifies a transmission signal having a higher frequency consumes more power. Thus, a heat dissipation member such as heat-dissipating via-conductor 95V is desirably disposed in a region included in principal surface 91b that overlaps the footprint of power amplifier 20A. According to the above configuration, the control line can be shortened since the footprint of power amplifier 10A at least partially overlaps the footprint of switch 42, and the footprint of power amplifier 20A does not overlap the footprint of switch 42 so that switch 42 can be prevented from being damaged by heat dissipated from power amplifier 20A while heat dissipation of power amplifier 20A improves.

Radio frequency module 1 may further include: output transformer 15 that includes primary coil 15a and secondary coil 15b; and output transformer 25 that includes primary coil 25a and secondary coil 25b. Power amplifier 10A may include amplifying elements 12 and 13. Power amplifier 20A may include amplifying elements 22 and 23. An end of primary coil 15a may be connected to an output terminal of amplifying element 12. Another end of primary coil 15a may be connected to an output terminal of amplifying element 13. An end of secondary coil 15b may be connected to an output terminal of power amplifier 10A. An end of primary coil 25a may be connected to an output terminal of amplifying element 22. Another end of primary coil 25a may be connected to an output terminal of amplifying element 23. An end of secondary coil 25b may be connected to an output terminal of power amplifier 20A. Power amplifier 10A and output transformer 15 may be included in transmission amplifier circuit 10, and power amplifier 20A and output transformer 25 may be included in transmission amplifier circuit 20.

According to this, amplifying elements 12 and 13 operate in antiphase relationship with respect to each other, and thus a decrease in power gain of transmission amplifier circuit 10 can be reduced. Further, amplifying elements 22 and 23 operate in antiphase relationship with respect to each other, and thus a decrease in power gain of transmission amplifier circuit 20 can be reduced. Further, a non-inverted signal and an inverted signal amplified by amplifying elements 12 and 13 are combined, and a non-inverted signal and an inverted signal amplified by amplifying elements 22 and 23 are combined. Thus, unnecessary waves such as harmonic components, for instance, in radio frequency module 1, can be decreased.

In radio frequency module 1C, output transformer 15 may be larger than output transformer 25, and in a plan view of module board 91, the footprint of power amplifier 10A may at least partially overlap the footprint of switch 42, and the footprint of power amplifier 20A may not overlap the footprint of switch 42.

Out of output transformers 15 and 25, output transformer 25 that outputs a transmission signal having a higher frequency has a smaller volume. According to the above configuration, the signal line can be shortened since the footprint of power amplifier 10A at least partially overlaps the footprint of switch 42, and the footprint of power amplifier 20A does not overlap the footprint of switch 42 so that switch 42 can be prevented from being damaged by heat dissipated from power amplifier 20A while heat dissipation of power amplifier 20A improves.

In radio frequency module 1, in a plan view of module board 91, footprints of power amplifiers 10A and 20A may not each overlap both of footprints of output transformers 15 and 25.

Output transformers 15 and 25 each need to have a high Q factor to handle a high-power transmission signal, and thus desirably, magnetic fields formed by output transformers 15 and 25 do not change due to power amplifiers 10A and 20A being adjacent thereto. According to the above configuration, power amplifiers 10A and 20A are not disposed in regions where the transformers are disposed, and thus the Q factors of the inductors included in output transformers 15 and 25 can be maintained high.

In radio frequency module 1, output transformers 15 and 25 may be disposed on principal surface 91a, and in the plan view of module board 91, no circuit component may be disposed in a region included in principal surface 91b that overlaps the footprint of output transformer 15, and no circuit component may be disposed in a region included in principal surface 91b that overlaps the footprint of output transformer 25.

According to this configuration, no circuit component is disposed in the regions in principal surface 91b, and thus the Q factors of the inductors included in output transformers 15 and 25 can be maintained high.

In radio frequency module 1, output transformers 15 and 25 may be disposed on principal surface 91b, and in the plan view of module board 91, no circuit component may be disposed in a region included in principal surface 91a that overlaps the footprint of output transformer 15, and no circuit component may be disposed in a region included in principal surface 91a that overlaps the footprint of output transformer 25.

According to this configuration, no circuit component is disposed in the regions in principal surface 91a, and thus the Q factors of the inductors included in output transformers 15 and 25 can be maintained high.

In radio frequency module 1, output transformers 15 and 25 may be formed inside of module board 91, between principal surface 91a and principal surface 91b, and in the plan view of module board 91, no circuit component may be disposed in a region included in principal surface 91a that overlaps the footprint of output transformer 15, no circuit component may be disposed in a region included in principal surface 91b that overlaps the footprint of output transformer 15, no circuit component may be disposed in a region included in principal surface 91a that overlaps the footprint of output transformer 25, and no circuit component may be disposed in a region included in principal surface 91b that overlaps the footprint of output transformer 25.

According to this configuration, no circuit component is disposed in the regions in principal surfaces 91a and 91b, and thus the Q factors of the inductors included in output transformers 15 and 25 can be maintained high.

In radio frequency module 1, output transformers 15 and 25 may be disposed inside of module board 91, between principal surface 91a and principal surface 91b, output transformers 15 and 25 being offset toward one of principal surface 91a and principal surface 91b, and in the plan view of module board 91, no circuit component may be disposed in a region included in the one of principal surface 91a and principal surface 91b that overlaps the footprint of output transformer 15, no circuit component may be disposed in a region included in the one of principal surface 91a and principal surface 91b that overlaps the footprint of output transformer 25, a circuit component may be disposed in a region included in a remaining one of principal surface 91a and principal surface 91b that overlaps the footprint of output transformer 15, and a circuit component may be disposed in a region included in the remaining one of principal surface 91a and principal surface 91b that overlaps the footprint of output transformer 25.

Also in this case, no circuit component is disposed in the above regions in the one of principal surfaces 91a and 91b closer to output transformers 15 and 25, and thus the Q factors of the inductors included in output transformers 15 and 25 can be maintained high.

Communication device 5 includes: antenna 2; RFIC 3 configured to process radio frequency signals transmitted and received by antenna 2; and radio frequency module 1 configured to transfer the radio frequency signals between antenna 2 and RFIC 3.

According to this configuration, small communication device 5 that supports multiband technology can be provided.

Other Embodiments Etc.

The above has described the radio frequency module and the communication device according to the embodiment of the present disclosure, based on an embodiment, examples, and variations, yet the radio frequency module and the communication device according to the present disclosure are not limited to the above embodiment, examples, and variations. The present disclosure also encompasses another embodiment achieved by combining arbitrary elements in the embodiment, the examples, and the variations, variations as a result of applying various modifications that may be conceived by those skilled in the art to the embodiment, the examples, and the variations without departing from the scope of the present disclosure, and various apparatuses that include the radio frequency module and the communication device.

For example, in the radio frequency modules and the communication devices according to the embodiment, the examples, and the variations, another circuit element and another line, for instance, may be disposed between circuit elements and paths connecting signal paths that are illustrated in the drawings.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in communication apparatuses such as mobile phones, as a radio frequency module disposed in a front-end portion, which supports multiband technology.

The invention claimed is:

1. A radio frequency module, comprising:
a first transmission input terminal;
a second transmission input terminal;

a module board that includes a first principal surface and a second principal surface on opposite sides of the module board;

a first power amplifier configured to amplify a transmission signal in a first frequency band;

a second power amplifier configured to amplify a transmission signal in a second frequency band different from the first frequency band;

a first transmission filter;

a first output transformer that includes a first coil and a second coil;

a second transmission filter;

a second output transformer that includes a third coil and a fourth coil;

a first switch including a first common terminal connected to an output terminal of the first power amplifier, a second common terminal connected to an output terminal of the second power amplifier, a first selection terminal connected to the first transmission filter, and a second selection terminal connected to the second transmission filter; and a second switch including a third common terminal directly connected to an input terminal of the first power amplifier, a third selection terminal connected to the first transmission input terminal and a fourth selection terminal connected to the second transmission input terminal, wherein the first power amplifier and the second power amplifier are disposed on the first principal surface, the first switch is disposed on the second principal surface, the second switch is disposed on the first principal surface or the second principal surface, the first output transformer and the second output transformer are disposed inside the module board between the first principal surface and the second principal surface, and the first output transformer and the second output transformer are closer to one principal surface of the first principal surface and the second principal surface than another principal surface of the first principal surface and the second principal surface.

2. The radio frequency module of claim 1, wherein a plurality of external-connection terminals disposed on the second principal surface.

3. The radio frequency module of claim 2, wherein the second switch is disposed on the first principal surface.

4. The radio frequency module of claim 2, wherein the second switch is disposed on the second principal surface.

5. The radio frequency module of claim 4, wherein a control circuit and the second switch are included in a first semiconductor integrated circuit.

6. The radio frequency module of claim 4, wherein the first switch and the second switch are included in a first semiconductor integrated circuit.

7. The radio frequency module of claim 4, wherein a control circuit, the first switch and the second switch are included in a first semiconductor integrated circuit.

8. The radio frequency module of claim 1, further comprising:

a heat-dissipating via-conductor connected to at least one of a ground electrode of the first power amplifier or a ground electrode of the second power amplifier, the heat-dissipating via-conductor extending from the first principal surface to the second principal surface.

9. The radio frequency module of claim 8, wherein the heat-dissipating via-conductor is connected, on the second principal surface, to an external-connection terminal having a ground potential out of the plurality of external-connection terminals.

10. The radio frequency module according to claim 1, further comprising:

a low noise amplifier configured to amplify a reception signal and disposed on the second principal surface.

11. The radio frequency module of claim 10, wherein in the plan view of the module board, no circuit component is disposed in a region of the first principal surface that overlaps a footprint of the first output transformer, no circuit component is disposed in a region of the second principal surface that overlaps the footprint the first output transformer, no circuit component is disposed in a region of the first principal surface that overlaps a footprint of the second output transformer, and no circuit component is disposed in a region of the second principal surface that overlaps the footprint of the second output transformer.

12. The radio frequency module of claim 1, wherein the first power amplifier includes a first amplifying element and a second amplifying element, the second power amplifier includes a third amplifying element and a fourth amplifying element, the first power amplifier and the first output transformer are included in a first transmission amplifier circuit, the second power amplifier and the second output transformer are included in a second transmission amplifier circuit, a first end of the first coil is connected to an output terminal of the first amplifying element, a second end of the first coil is connected to an output terminal of the second amplifying element, a first end of the second coil is connected to an output terminal of the first transmission amplifier circuit, a first end of the third coil is connected to an output terminal of the third amplifying element, a second end of the third coil is connected to an output terminal of the fourth amplifying element, and a first end of the fourth coil is connected to an output terminal of the second transmission amplifier circuit.

13. The radio frequency module of claim 12, wherein in a plan view of the module board, a footprint of the first power amplifier and a footprint of the second power amplifier each do not overlap both a footprint of the first output transformer and a footprint of the second output transformer.

14. The radio frequency module of claim 13, wherein the first output transformer and the second output transformer are disposed on the first principal surface, and in the plan view of the module board, no circuit component is disposed in a region of the second principal surface that overlaps the footprint of the first output transformer, and no circuit component is disposed in a region of the second principal surface that overlaps the footprint of the second output transformer.

15. The radio frequency module of claim 13, wherein the first output transformer and the second output transformer are disposed on the second principal surface, and in the plan view of the module board, no circuit component is disposed in a region of the first principal surface that overlaps the footprint of the first output transformer, and no circuit component is disposed in a region of the first principal surface that overlaps the footprint of the second output transformer.

16. The radio frequency module of claim 1, wherein in the plan view of the module board, no circuit component is disposed in a region of the one principal surface that overlaps the footprint of the first output transformer, no circuit component is disposed in a region of the one principal surface that overlaps the footprint of the second output transformer, a circuit component is disposed in a region of the another principal surface that overlaps the footprint of the first output transformer, and a circuit component is disposed in a region of the another principal surface that overlaps the footprint of the second output transformer.

17. A radio frequency module, comprising:

a first transmission input terminal;

a module board that includes a first principal surface and a second principal surface on opposite sides of the module board;

a first power amplifier configured to amplify a transmission signal in a first frequency band;

a second power amplifier configured to amplify a transmission signal in a second frequency band different from the first frequency band;

a first transmission filter;

a second transmission filter;

a first switch including a first common terminal connected to an output terminal of the first power amplifier, a second common terminal connected to an output terminal of the second power amplifier, a first selection terminal connected to the first transmission filter, and a second selection terminal connected to the second transmission filter; and a second switch including a third common terminal directly connected to an input terminal of the first power amplifier, a third selection terminal connected to the first transmission input terminal, wherein the first power amplifier and the second power amplifier are disposed on the first principal surface, the first switch is disposed on the second principal surface, and the second switch is disposed on the first principal surface or the second principal surface, the first output transformer is larger than the second output transformer, and in a plan view of the module board, a footprint of the first power amplifier at least partially overlaps a footprint of the first switch, and a footprint of the second power amplifier does not overlap the footprint of the first switch.

* * * * *